US010536082B2

(12) United States Patent
Imade et al.

(10) Patent No.: US 10,536,082 B2
(45) Date of Patent: Jan. 14, 2020

(54) POWER SUPPLY DEVICE, SEMICONDUCTOR INTEGRATED CIRCUIT, AND METHOD FOR SUPPRESSING RIPPLE COMPONENT

(71) Applicants: Daisuke Imade, Isehara (JP); Naoto Endo, Tama (JP)

(72) Inventors: Daisuke Imade, Isehara (JP); Naoto Endo, Tama (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/231,538

(22) Filed: Dec. 23, 2018

(65) Prior Publication Data
US 2019/0207520 A1 Jul. 4, 2019

(30) Foreign Application Priority Data

Dec. 28, 2017 (JP) .................................. 2017-252780
Nov. 9, 2018 (JP) .................................. 2018-211614

(51) Int. Cl.
*H02M 1/15* (2006.01)
*H02M 3/335* (2006.01)
(Continued)

(52) U.S. Cl.
CPC .......... *H02M 3/33507* (2013.01); *H02M 1/15* (2013.01); *H03K 5/24* (2013.01);
(Continued)

(58) Field of Classification Search
CPC .......... H02M 1/15; H02M 1/14; H02M 1/143; H02M 3/33507; H02M 2001/007; H05B 33/0815
See application file for complete search history.

(56) References Cited

U.S. PATENT DOCUMENTS 8,476,965 B2 * 7/2013 Santo ...................... G05F 1/561
327/427
9,013,899 B2 4/2015 Shimada et al.
(Continued)

FOREIGN PATENT DOCUMENTS

| CN | 106211484 A | 12/2016 |
| EP | 3258743 A1 | 12/2017 |
| JP | 2012200118 A | 10/2012 |

OTHER PUBLICATIONS

Extended European Search Report (EESR) dated May 8, 2019 issued in European Application No. 18215206.6.

Primary Examiner — Harry R Behm
(74) Attorney, Agent, or Firm — Holtz, Holtz & Volek PC

(57) ABSTRACT

A power supply device includes a voltage conversion circuit, a current controller and a current controlling circuit. The voltage conversion circuit generates a DC voltage from an AC power source and outputs the DC voltage to a pair of output terminals. The current controller is disposed on a first current path through which an output current flows and controls the current in the first current path. The current controlling circuit drives the current controller so as to reduce a ripple component generated in the output current, based on (i) a voltage at a first potential point set on a path from an output terminal at a high-potential side of the voltage conversion circuit to the current controller in the first current path and (ii) a current detecting voltage indicating the magnitude of the output current.

12 Claims, 17 Drawing Sheets

(51) Int. Cl.
    *H03K 5/24*     (2006.01)
    *H05B 33/08*     (2006.01)
    *G01R 19/165*     (2006.01)
    *H02M 1/00*     (2006.01)

(52) U.S. Cl.
    CPC ... *H05B 33/0815* (2013.01); *G01R 19/16552* (2013.01); *H02M 2001/0009* (2013.01)

(56) References Cited

U.S. PATENT DOCUMENTS

| | | | |
|---|---|---|---|
| 9,101,020 B2* | 8/2015 | Wang | H05B 33/0818 |
| 2014/0085945 A1* | 3/2014 | Kuang | G05F 1/563 |
| | | | 363/46 |
| 2014/0354186 A1* | 12/2014 | Sun | H05B 33/0815 |
| | | | 315/310 |
| 2016/0135258 A1* | 5/2016 | Wang | H05B 33/0845 |
| | | | 315/200 R |
| 2017/0070143 A1* | 3/2017 | Lee | H02M 3/157 |
| 2017/0110979 A1 | 4/2017 | Chang et al. | |
| 2017/0215238 A1 | 7/2017 | Kim et al. | |
| 2017/0318639 A1* | 11/2017 | Wang | H05B 33/0812 |
| 2018/0063911 A1 | 3/2018 | Bai et al. | |

\* cited by examiner

POWER SUPPLY DEVICE, SEMICONDUCTOR INTEGRATED CIRCUIT, AND METHOD FOR SUPPRESSING RIPPLE COMPONENT

CROSS REFERENCE TO RELATED APPLICATION

This application is based upon and claims the benefit of priority under 35 USC 119 of Japanese Patent Applications No. 2017-252780 and No. 2018-211614 respectively filed on Dec. 28, 2017 and Nov. 9, 2018, the entire disclosure of which, including the descriptions, claims, drawings and abstract, are incorporated herein by reference in their entirety.

BACKGROUND OF THE INVENTION

1. Field of the Invention

The present invention relates to a power supply device, a semiconductor integrated circuit, and a method of suppressing a ripple component.

2. Description of Related Art

Reductions in generation of radiofrequency waves have been in greater demand in power-saving lighting fixtures including light emitting diodes in recent years. If reductions in generation of harmonic waves are enhanced in power supply devices that generate DC voltages from AC power sources, ripple readily occurs at output stages depending on the frequency of the AC power sources.

Japanese Unexamined Patent Application Publication No. 2012-200118 discloses a constant-current power supply device that generates DC voltage from an AC power source to turn on a light emitting diode. The constant-current power supply device includes a switching transistor and a current-detecting resistor that are connected in series for turning on or off the light emitting diode in a path of current to be outputted to the light emitting diode.

Constant current control can remove the ripple component from the current to be outputted to a load even if the voltage to be outputted to the load is rippled. The present inventors have investigated a constant-current circuit that includes a current-controlling transistor in the path of output current where the transistor controls the current following in a load to a predetermined level through control of the ON resistance of the transistor. As shown in FIG. 1A, this configuration can remove the ripple component from the output current through a variation in ON resistance of the current-controlling transistor regardless of the ripple component in the output voltage VLED+ at the high potential side. In detail, a ripple component having the same phase is added to the output voltage VLED− at the low-potential side, so that a constant voltage is kept between a pair of output terminals and ripple-free output current can be supplied to a load.

Such a configuration however has a disadvantage in that the current-controlling transistor has large loss, for example, at some current values limited by the constant-current circuit as shown in FIG. 1B. Compared to the current value in FIG. 1A, the current-controlling transistor has excess loss by a voltage drop Vb at the current value in FIG. 1B. In contrast, if the current value limited by the constant-current circuit is significantly low as shown in FIG. 1C, the current-controlling transistor cannot absorb ripple voltage caused, for example, by a fluctuation in power supplied from the input stage, resulting in a risk of an insufficient reduction in ripple component in the output current.

The constant-current power supply device disclosed in Japanese Unexamined Patent Application Publication No. 2012-200118 performs constant current control through feedback of a signal detected using a current-detecting resistor in the path of the output current to a control circuit in a DC/DC converter. However, such control cannot sufficiently remove the ripple component from the output current under an enhanced harmonic reduction.

SUMMARY OF THE INVENTION

An object of the present invention is to provide a power supply device that converts an AC power source to a DC voltage to supply a load and that can suppress the ripple component occurring in the output current, at low loss, a semiconductor integrated circuit, and a method of suppressing the ripple component.

To achieve at least one of the abovementioned objects, according to an aspect of the present invention, a power supply device includes:

a voltage conversion circuit that generates a DC voltage from an AC power source and outputs the DC voltage to a pair of output terminals;

a current controller that is disposed on a first current path through which an output current flows and that controls the current in the first current path; and a current controlling circuit that drives the current controller so as to reduce a ripple component generated in the output current, based on (i) a voltage at a first potential point set on a path from an output terminal at a high-potential side of the voltage conversion circuit to the current controller in the first current path and (ii) a current detecting voltage indicating the magnitude of the output current.

Such a configuration enables the voltage conversion circuit to output a DC voltage containing the ripple voltage generated in an AC power source to a pair of output terminals. However, the current controller controlling the current in the first current path through which an output current flow and the current controlling circuit driving the current controller can suppress the ripple component in the output current. Furthermore, the current controlling circuit controls the current controller based on the current detecting voltage indicating the magnitude of the output current and the voltage at the first potential point in the path from the output terminal at a high potential side of the voltage converting circuit to the current controller; hence, the current controller is driven to suppress the ripple component in the output current and to minimize the loss in the current controller. Accordingly, an output current containing a reduced amount of ripple can be supplied to a load at low loss.

Preferably, the current controlling circuit drives the current controller such that a bottom ripple voltage at the first potential point converges to a balanced voltage which is a minimum voltage.

Such a configuration enables a current containing a reduced amount of ripple component to be outputted at low loss through control of the bottom ripple voltage at the first potential point to a balanced voltage.

Preferably, the current controlling circuit includes:

a voltage-retaining module that retains a reference voltage;

a differential circuit that outputs a drive signal to the current controller so as to decrease a difference between the reference voltage and the current detecting voltage;

a reducing circuit that reduces the reference voltage;

a first voltage divider circuit that generates a first divided voltage generated at a predetermined division ratio from the reference voltage; and a first comparator that compares the first divided voltage with the current detecting voltage and allows the reducing circuit to lower the reference voltage if the first divided voltage is higher than the current detecting voltage.

Such a configuration enables the ripple component in the output current to be reduced to a small rate that is determined by the division ratio of the first divider circuit. Since the output current is controlled so as to contain a small amount of ripple component, the current controller has a reduced loss. As a result, a current containing a reduced amount of ripple component can be outputted at low loss.

Preferably, the current controlling circuit further includes:

a first raising circuit capable that raises the reference voltage; and a second comparator that compares the voltage at the first potential point with a predetermined reference voltage and allows the first raising circuit to raise the reference voltage if the voltage at the first potential point is higher than the reference voltage.

Such a configuration can raise the voltage at the first potential point; hence, the reference voltage can be raised not so as to increase the loss in the current controller if the voltage increases at the first potential point. A combination of this control and the control suppressing the ripple component described above achieves output of current containing a reduced amount of ripple component at low loss for a long term.

Preferably, the reference voltage is set above the voltage at the first potential point where the output current contains no ripple component, and the division ratio of the first voltage divider circuit is set to 1−x, where x is a ratio of the allowable ripple current to the upper end value of the output current.

Such setting can suppress the ripple component in the output current below an allowable level.

Preferably, a voltage lowering capacity of the lowering circuit is lower than a voltage raising capacity of the first raising circuit.

As the reference voltage deviates upwardly from a proper value, the current supplied by the current controller increases. If the current from the current controller exceeds the current capacity of the voltage conversion circuit, the ripple component increases in the output current. In contrast, the reference voltage deviates downwardly from the proper value, the current supplied by the current controller decreases. If the output current from the current controller is large, the loss in the current controller increases. Using the correlation between the voltage raising ability of the first raising circuit and the voltage lowering ability of the reducing circuit, the reference voltage can be promptly raised if the reference voltage is less than the proper value. The reference voltage can then gradually converge to the proper value. Such a configuration can avoid a continuous high-loss state of the current controller for a long term at a transitional state of the circuit, for example, an increase or decrease in the output power from the voltage converting circuit.

Preferably, the current controlling circuit further includes:

a second raising circuit that raises the reference voltage with a capacity lower than a voltage lowering capacity of the lowering circuit;

a second voltage divider circuit that divides the reference voltage to generate a second divided voltage higher than the first divided voltage; and a logical module that permits the second raising circuit to raise the reference voltage after a term during which the current detecting voltage does not fall below the first divided voltage exceeds a predetermined term.

Such a configuration enables the reduced amount of ripple component in the output current to converge to a range determined by the division ratio of the first voltage divider circuit. If some variable factor occurs, the ripple component does not disappear and thus the loss in the current controller does not increase.

Preferably, the current controlling circuit further includes:

a second raising circuit that raises the reference voltage with a capacity lower than a voltage lowering capacity of the lowering circuit;

a logical module that permits the second raising circuit to raise the reference voltage after a term during which the current detecting voltage does not fall below the first divided voltage exceeds a predetermined term; and a second voltage divider circuit that divides the reference voltage to generate a second divided voltage higher than the first divided voltage; and a third comparator that compares the second divided voltage with the current detecting voltage, wherein the logical module allows the second raising circuit to raise the reference voltage based on the result of comparison by the second comparator and the result of comparison by the third comparator after the current detecting voltage falls below the second divided voltage and after a term during which the current detecting voltage does not fall below the first divided voltage exceeds a predetermined term.

Such a configuration can constantly detect a continuous reduced amount of ripple component in the output current that is maintained below a level determined by the division ratio of the first voltage divider circuit. The reference voltage is raised based on the detection, so that the ripple component in the output voltage converges to the target ratio. Regardless of some variable factor, the loss in the current controller does not increase.

Preferably, the current controlling circuit includes:

a voltage retainer that holds the reference voltage;

a differential circuit that outputs a drive signal to the current controller so as to decrease the difference between the reference voltage and the current detecting voltage; and a bottom voltage controller that receives the voltage at the first potential point as a detection voltage and controls the reference voltage based on the comparison of detection voltages at different times.

Such a configuration enables the bottom voltage controller to detect an increase in loss in the current controller, from the detection voltage. The current controlling circuit enables the bottom ripple voltage at the first potential point to converge to the balanced voltage that reduces the loss occurring in the current controller, based on the detection.

Preferably, the current controlling circuit further includes a variation adder that adds a variation to the reference voltage held by the voltage-retaining module.

If the detection voltage is stabilized, a variation in loss in the current circuit or the ripple component in the output current could not be detected. Such a configuration, however, enables the variation adder to add a variation to avoid the stabilization of the detection voltage, resulting in secure detection of a variation in loss in the current circuit and the ripple component in the output current. The bottom ripple voltage at the output terminal on the cathode side can promptly converge to the balanced voltage based on the detection voltage, as long as the ripple component in the output current is maintained at a low level.

Preferably, the power supply device further includes a lighting device connected to the pair of output terminals.

Such a configuration provides a power supply device that can reduce generation of harmonic waves and flickering with low loss in lighting devices, such as light emitting diodes and organic EL devices.

According to another aspect of the present invention, a semiconductor integrated circuit (i) is mounted in a power supply device including a voltage conversion circuit that generates a DC voltage from an AC power source and outputs the DC voltage to a pair of output terminals and (ii) drives a current controller that controls a current in a current path through which an output current flows, the circuit including:

a differential circuit that outputs a drive signal to the current controlling circuit so as to decrease the difference between the reference voltage and the current detecting voltage indicating the magnitude of the output current;

a first comparator that (i) compares a first divided voltage generated by division of the reference voltage with the current detecting voltage and (ii) lowers the reference voltage if the current detecting voltage is lower than the first divided voltage; and a second comparator that (i) compares a predetermined reference voltage with a voltage at a first potential point set on a path from an output terminal at a high potential side of the voltage conversion circuit to the current controller in the current path through which the output current flows, and (ii) raises the reference voltage if the voltage at the first potential point is higher than the reference voltage.

According to still another aspect of the present invention, a semiconductor integrated circuit (i) is mounted in a power supply device including a voltage conversion circuit that generates a DC voltage from an AC power source and outputs the DC voltage to a pair of output terminals and (ii) drives a current controller that controls a current in a current path through which an output current flows, the circuit including:

a differential circuit that outputs a drive signal to the current controller so as to decrease the difference between the reference voltage and the current detecting voltage indicating the magnitude of the output current; and a bottom voltage controller that varies the reference voltage such that the bottom ripple voltage at a first potential point converges to a balanced voltage which is a minimum voltage, the first potential point being set on a path from an output terminal at a high potential side of the voltage conversion circuit to the current controller in the current path through which the output current flows.

These semiconductor integrated circuits can be assembled in a power supply device including a voltage converting circuit that outputs a DC voltage containing a ripple component from a pair of output terminals. The drive of the current controller can suppress the ripple component in the output current in the power supply device at reduced loss.

According to still another aspect of the present invention, a method for suppressing a ripple component in a power supply device including a voltage conversion circuit that generates a DC voltage from an AC power source and outputs the DC voltage to a pair of output terminals includes:

driving a current controller that controls a current in a current path through which an output current flows; and suppressing the ripple component occurring in the output current, wherein the method further includes:

outputting a drive signal to the current controller such that a difference between a reference voltage and a current detecting voltage indicating a magnitude of the output current;

comparing the current detecting voltage with a first divided voltage generated by division of the reference voltage and lowering the reference voltage if the current detecting voltage is lower than the first divided voltage; and comparing a predetermined reference voltage with a voltage at a first potential point set on a path from an output terminal at a high potential side of the voltage conversion circuit to the current controller in the current path through which the output current flows, and raising the reference voltage if the voltage at the first potential point is higher than the reference voltage.

According to still another aspect of the present invention, a method for suppressing a ripple component in a power supply device including a voltage conversion circuit that generates a DC voltage from an AC power source and outputs the DC voltage to a pair of output terminals includes:

driving a current controller that controls a current in a current path through which an output current flows; and suppressing the ripple component occurring in the output current, wherein the method further includes:

outputting a drive signal to the current controller such that a difference between a reference voltage and a current detecting voltage indicating a magnitude of the output current;

varying the reference voltage such that a bottom ripple voltage at a first potential point converges to a balanced voltage which is a minimum voltage, the first potential point being set on a path from an output terminal at a high potential side of the voltage conversion circuit to the current controller in the current path through which the output current flows.

These methods can suppress the ripple component in the output current at the current controller and reduce the loss in the current controller even if a DC voltage containing a ripple component is outputted from the voltage converting circuit to the pair of output terminals.

The present invention provides a power supply device that converts an AC power source to a DC voltage to supply a load and that can reduce the ripple component in the output current, at low loss, a semiconductor integrated circuit, and a method of suppressing the ripple component.

BRIEF DESCRIPTION OF THE DRAWINGS

The advantages and features provided by one or more embodiments of the invention will become more fully understood from the detailed description given hereinbelow and the appended drawings which are given byway of illustration only, and thus are not intended as a definition of the limits of the present invention.

DETAILED DESCRIPTION OF THE PREFERRED EMBODIMENT

The embodiments of the present invention will now be described in detail with reference to the accompanying drawings.

First Embodiment

Figure 2:
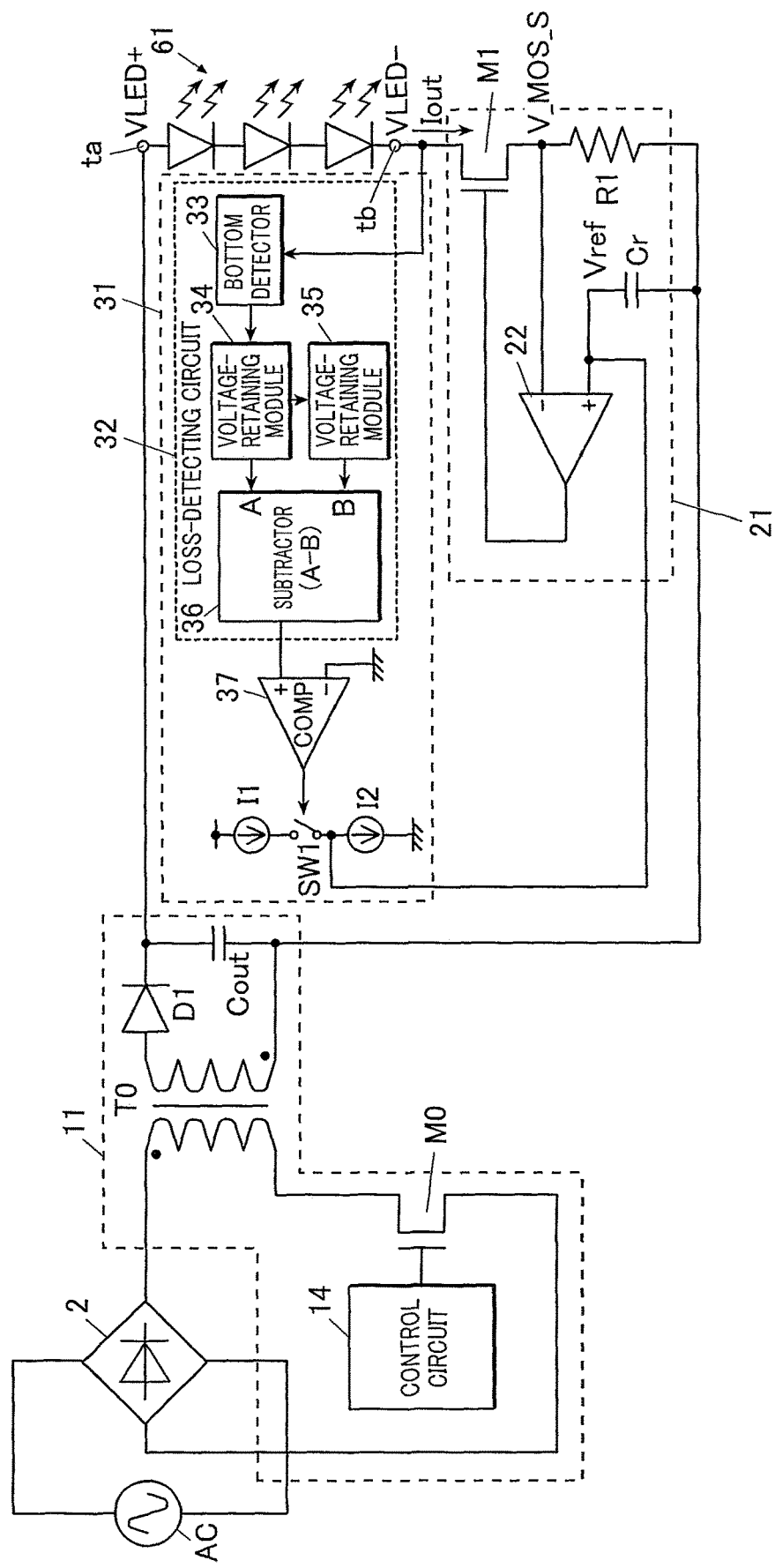
FIG. 2 is a circuit diagram illustrating a power supply device according to the first embodiment of the present invention.

FIG. 2 is a circuit diagram illustrating a power supply device according to the first embodiment of the present invention. The power supply device 1 of the first embodiment includes a rectifier circuit 2 that rectifies the voltage from an alternating current power source AC, a DC/DC converter 11 that converts the output voltage from the rectifier circuit 2 to a DC voltage, a constant-current circuit 21 provided in a path of the output current Iout and controlling the output current Iout to a target current, and a bottom voltage controller 31 controlling the current controlled by the constant-current circuit 21. The power supply device 1 is provided with light emitting diodes 61 for lighting as a load between output terminals ta and tb.

In this configuration, the rectifier circuit 2 and the DC/DC converter 11 correspond to an example of the voltage conversion circuit of the present invention. The transistor M1 in the constant-current circuit 21 corresponds to an example of the current controller of the present invention. A combination of the bottom voltage controller 31 and error amplifier 22 and a capacitor Cr of the constant-current circuit 21 corresponds to an example of the current control circuit of the present invention. The capacitor Cr corresponds to an example voltage retainer of the present invention. The error amplifier 22 corresponds to an example differential circuit of the present invention. The drain terminal (output terminal tb at the low potential side) of the transistor M1 corresponds to an example first potential point of the present invention. The source voltage V_MOS_S corresponds to an example current detecting voltage of the present invention.

A typical example of the DC/DC converter 11 is a flyback converter that converts the output voltage from the rectifier circuit 2 to a DC voltage. The DC/DC converter 11 includes a flyback transformer T0, a switching device M0 such as a field effect transistor, a control circuit 14 driving the switching device M0, a rectifier diode D1 connected to the secondary side of the flyback transformer T0, and an output capacitor Cout. The control circuit 14 receives the feedback of the voltage and/or current from a detector device (not shown) connected to the secondary side of the flyback transformer T0 and controls the switching device M0 so as to maintain the voltage and/or current at predetermined levels. Under the control of the switching device M0 by the control circuit 14, the DC/DC converter 11 operates so as to reduce harmonic waves.

The constant-current circuit 21 is disposed in the path of the output current Iout and controls the output current Iout to a target value. The constant-current circuit 21 includes transistor M1 for controlling the current and a current detecting resistor R1 connected in series from the output terminal tb at a low potential side, an error amplifier 22 controlling the control terminal (gate terminal) of the transistor M1 based on the voltage detected by the current detecting resistor R1, and a capacitor Cr generating a reference potential.

An example of the transistor M1 is a metal oxide semiconductor field effect Transistor (MOSFET) which is provided in the path of the output current Iout such that the output current Iout flows from the source to the drain. The transistor M1 is a current controlling device that can control the drain current through control of the gate voltage and thereby a variation in ON resistance between the source and the drain.

The current detecting resistor R1 is connected to both the reference potential (potential at low potential side of the output capacitor Cout) and the transistor M1. The current detecting resistor R1 outputs a detection voltage corresponding to the output current Iout to a node to the transistor M1.

In other words, a detection voltage in proportion to the output current Iout is outputted to the two terminals of the current detecting resistor R1.

The capacitor Cr generates a reference voltage Vref and supplies the voltage to the non-inverting input terminal of the error amplifier 22.

The error amplifier 22 receives the detection voltage from the current detecting resistor R1 through the inverting input terminal, and outputs the voltage corresponding to the difference between the detection voltage and the reference voltage Vref to the control terminal of the transistor M1. If the reference voltage Vref is the product of a target current Ia and the resistance R1 of the current detecting resistor, a current flowing in the current detecting resistor R1 greater than the target current Ia causes the output voltage to be inputted to the control terminal of the transistor M1 of the error amplifier 22 to be controlled so as to increase the ON resistance of the transistor M1. The output current Iout thereby decreases. A current flowing in the current detecting resistor R1 smaller than the target current Ia causes the output voltage to be inputted to the control terminal of the transistor M1 of the error amplifier 22 to be controlled so as to decrease the ON resistance of the transistor M1. The output current Iout thereby increases. Such an operation converges the output current Iout to the target current Ia.

Figure 3:
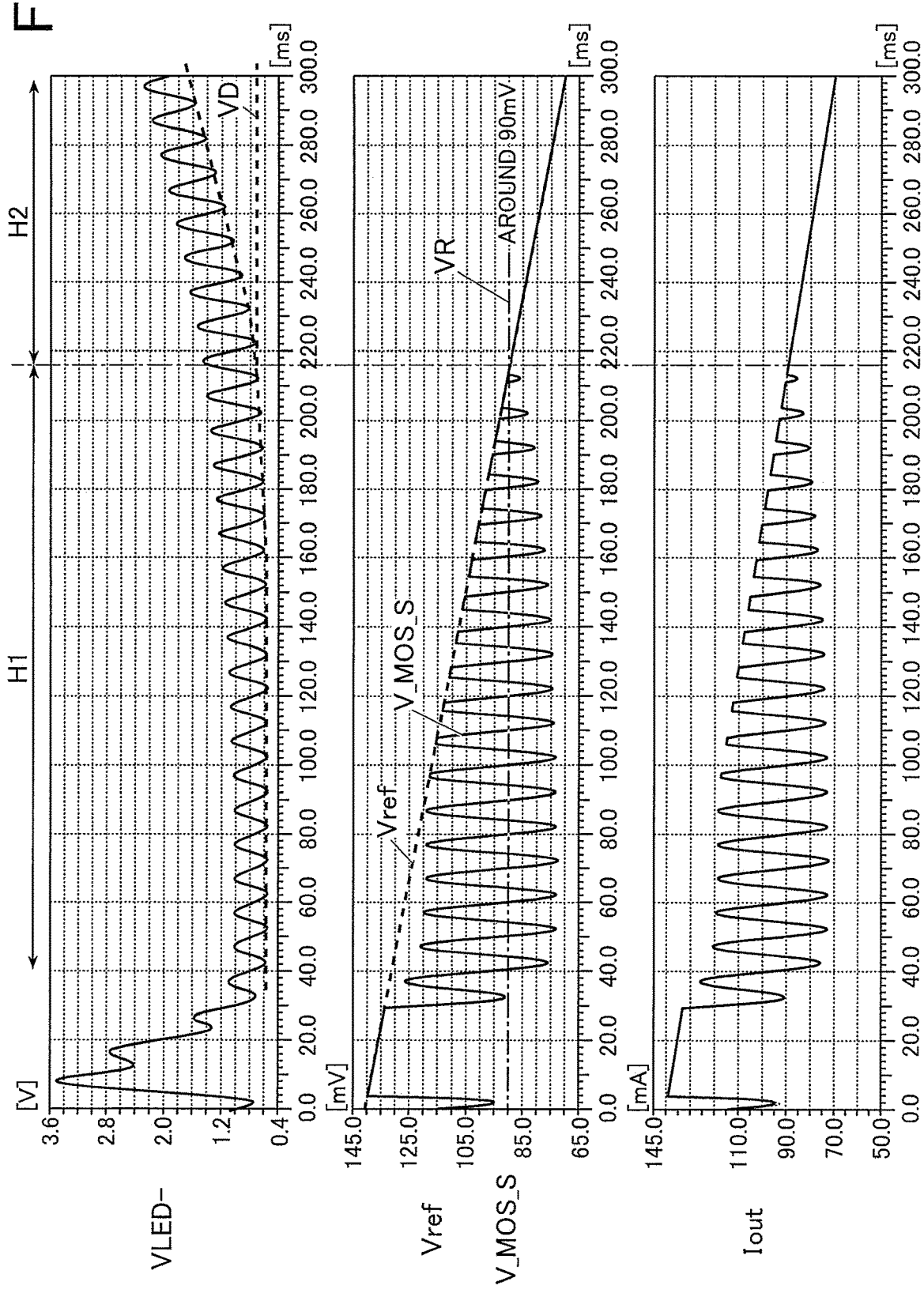
FIG. 3 includes signal waveform diagrams illustrating the operation of a power supply device at variable currents in a constant-current circuit.

The bottom voltage controller 31 controls the constant-current circuit 21 such that the bottom ripple voltage to be outputted to the output terminal tb at a low potential side reaches the balanced voltage VD (refer to FIG. 3). The balanced voltage VD indicates the lowest bottom voltage within a range where the ripple of the output current Iout is reduced. The range where the ripple component in the output current Iout is reduced includes not only a region where no ripple occurs but also a region where slight ripple that cannot be recognized as flickers in an image taken with a digital camera. If a current containing ripple of a non-negligible level flows in the light emitting diode, an image taken with a digital camera contains a stripe pattern (flickering). The bottom voltage controller 31 receives the output voltage VLED− at the low potential side as a detection voltage and raises or lowers the reference voltage Vref of the constant-current circuit 21 to vary the current value controlled by the constant-current circuit 21.

The bottom voltage controller 31 includes a loss-detecting circuit 32, a comparator 37, two current sources I1 and I2, and a switch SW1. The loss-detecting circuit 32 includes a bottom detector 33 detecting the bottom ripple voltage, voltage-retaining modules 34 and 35 retaining the bottom voltages detected at different times, and a subtractor 36 determining the difference in voltage retained in the voltage-retaining modules 34 and 35. In this configuration, a current source I2 corresponds to an example variation adder of the present invention.

The bottom detector 33 removes noise components and detects a minimum ripple voltage to allow a voltage-retaining module 34 to hold the minimum ripple voltage. The voltage-retaining module 34 transfers the latest retained voltage to another voltage-retaining module 35 every detection of a new bottom voltage at the bottom detector 33. The two voltage-retaining modules 34, 35 output their own voltage to the subtractor 36. The subtractor 36 calculates a differential voltage between the voltage-retaining modules 34, 35 and outputs the results to the comparator 37. The subtractor 36 outputs a positive voltage if the detected bottom voltage increases or a negative voltage if the detected bottom voltage decreases, in chronological order. The bottom detector 33, voltage-retaining modules 34, 35, and subtractor 36 may be digital circuits that perform the above-described processes to the output voltage VLED− at the low potential side after digital conversion or analog circuits that perform the processes by an analog scheme.

The comparator 37 compares the reference potential with the output from the subtractor 36, and turns on the switch SW1 in response to a positive voltage from the subtractor 36 or turns off the switch SW1 in other states. A current source I2 always extracts minute electric current from the capacitor Cr of the constant-current circuit 21 and gradually decreases the reference voltage Vref of the constant-current circuit 21. Another current source I1 supplies minute electric current to the capacitor Cr of the constant-current circuit 21 while the switch SW1 is being turned on and raises the reference voltage Vref of the constant-current circuit 21. The current value of the current source I2 is set to be greater than that of the current source I1.

In the power supply device 1 shown in FIG. 2, the bottom voltage controller 31, and the error amplifier 22 and the transistor M1 for controlling the current in the constant-current circuit 21 are disposed in the semiconductor integrated circuit fabricated in single chip.

Alternatively, the transistor M1 may be disposed outside of the semiconductor integrated circuit not inside of the semiconductor integrated circuit.

Explanation of Operation

In the power supply device 1 shown in FIG. 2, the generation of the harmonic waves can be reduced in the DC/DC converter 11. The output voltage VLED+ converted in the DC/DC converter 11 contains a ripple component depending on the frequency of the alternating current power source AC, while the constant-current circuit 21 controls the output current Iout from the power supply device 1 to a target current. In ordinal cases, the output voltage VLED− at the low potential side also contains the ripple component having the same phase and magnitude. Hence, the ripple component is removed from the output current Iout to be fed to the load.

FIG. 3 includes signal waveform diagrams illustrating the operation of a power supply device where the bottom voltage controller is halted while the current value controlled at the constant current circuit is varied. In FIG. 3, the symbol "VLED−" represents the output voltage from the output terminal tb at a low potential side, the symbol "Vref" represents the reference voltage of the error amplifier 22, the symbol "V_MOS_S" represents the source voltage of the transistor M1, and the symbol "Iout" represents the output current. The horizontal axis represents the time in FIG. 3, which illustrates the waveform when the current in the constant-current circuit 21 decreases at a predetermined rate.

The voltage and current at each node of the power supply device 1 will be explained in the case that the reference voltage Vref at the constant-current circuit 21 is lowered at a predetermined rate without control of the bottom voltage controller 31.

Within the range where the reference voltage Vref is higher than the voltage VR (range H1 in FIG. 3), the output voltage VLED− at the low potential side contains less ripple, and the ratio of the bottom ripple voltage of the output voltage VLED− at the low potential side to the reference voltage Vref decreases. Since the range H1 contains the term Tb until the operation region of the transistor M1 for current control is saturated, the transistor M1 cannot control the current to the target current in the peak region of the ripple voltage, resulting in a ripple component in the output current Iout.

As shown in the range H2 where the reference voltage Vref is lower than the voltage VR in FIG. 3, the bottom ripple voltage occurring in the output voltage VLED− at the low potential side depending on a variation in reference voltage Vref increases relatively significantly. Such an increase in the bottom voltage corresponds to the loss occurring in the transistor M1. Since the transistor M1 for current control operates in a non-saturated region over the entire period in the range H2, the current can be controlled to the target current. The output current Iout accordingly contains no ripple component.

The characteristic graphs shown in FIG. 3 indicates that the most suitable target current in the constant-current circuit 21 is set such that the bottom ripple voltage in the output voltage VLED− at the low potential side is the lowest balanced voltage VD within the range H2 generating no ripple component in the output current Iout. In the case that the bottom voltage is the balanced voltage VD, the loss occurring in the transistor M1 is minimized within the range where the ripple component is removed from the output current Iout. The balanced voltage VD lies at a border at which the slope indicating the ratio of the variation in bottom voltage to the target current varies from a relatively large slope to a slight slope nearly equal to zero.

The bottom voltage controller 31 converges the bottom ripple voltage of the output voltage VLED− at the low potential side to the balanced voltage VD based on the characteristics shown in FIG. 3. In detail, the bottom voltage controller 31 controls the current source I2 to add a variation causing a gradual decrease in voltage to the reference voltage Vref of the constant-current circuit 21. If the reference voltage Vref is within the range H2 in FIG. 3, such a variation causes the bottom voltage to undergo a temporal variation, resulting in positive output from the subtractor 36. The switch SW1 is thereby turned on to raise the reference voltage Vref and thus to shift the bottom voltage toward the balanced voltage VD.

If the reference voltage Vref is in the state of the range H1 in FIG. 3, no temporal variation occurs in the bottom voltage regardless of a fluctuation in the current source I2. The subtractor 36 thereby generates no positive output. As a result, the switch SW1 is not turned on, the reference voltage Vref decreases with the fluctuation in the current source I2, and the bottom voltage is shifted toward the balanced voltage VD. Such an operation converges the bottom ripple voltage of the output voltage VLED− at the low potential side to the balanced voltage VD.

As described above, the power supply device 1 and the method of reducing the ripple in the power supply device 1 of the first embodiment can generates DC voltage from an AC power source AC with reduced generation of harmonic waves. Hence, the ripple component in the output current Iout to be outputted to a load can be significantly reduced through the control of the constant-current circuit 21 even if the converted DC voltage contains a ripple component. The light from light emitting diode 61 thereby does not flicker.

The power supply device 1 and the method of reducing the ripple in the power supply device 1 of the first embodiment enables the bottom voltage controller 31 such that the bottom voltage of the output voltage VLED− to converge at the low potential side to the balanced voltage VD. The loss occurring in the transistor M1 of the constant-current circuit 21 can be reduced while the ripple component in the output current Iout is reduced.

Figure 1A:
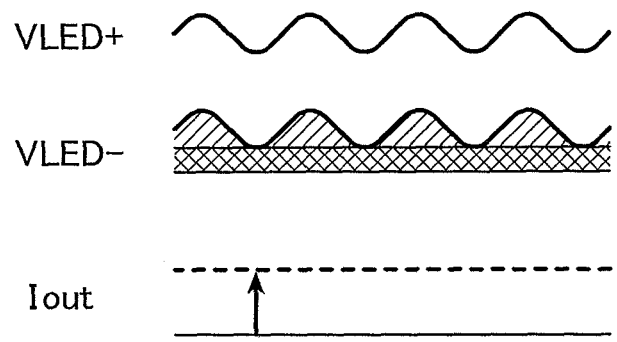
FIG. 1A is a waveform diagram at ideal output current in output characteristics of a power supply device provided with a constant-current circuit in a path of the output current.
Figure 1B:
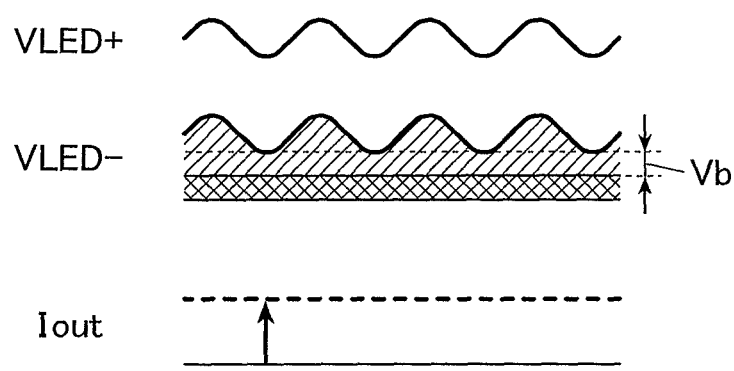
FIG. 1B is a waveform diagram at increased output current in output characteristics of a power supply device that is provided with a constant-current circuit in a path of the output current and that controls a larger amount of power than that in FIG. 1A.

In a comparative example, supposing that an error occurs causing an increase in the output voltage from the DC/DC converter 11 at a predetermined target current of the constant-current circuit 21. As shown in FIG. 1B, the transistor M1 of the constant-current circuit 21 is controlled such that a large voltage drop Vb occurs to maintain the target current in the constant-current circuit 21. Is this case, a loss corresponding to the voltage drop occurs in the transistor M1. The bottom voltage controller 31 of the power supply device 1 according to the first embodiment increases the target current in the constant-current circuit 21 and converges the bottom voltage of the output voltage VLED− at the low potential side to the balanced voltage VD regardless of such an error. In the constant-current circuit 21, the ON resistance of the transistor M1 is controlled at a low level such that the output current Iout increases, resulting in reduced loss in the constant-current circuit 21. Since the forward voltage Vf of the light emitting diode 61 slightly varies in response to the current value, a voltage drop in the light emitting diode 61 increases as the output current Iout increases. As a result, the ON resistance of the transistor M1 decreases and the loss in the constant-current circuit 21 decreases as shown in FIG. 1A.

Figure 1C:
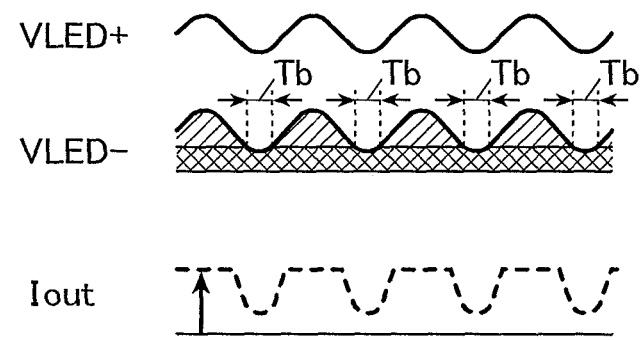
FIG. 1C is a waveform diagram at decreased output current in output characteristics of a power supply device that is provided with a constant-current circuit in a path of the output current and that controls a smaller amount of power than that in FIG. 1A.

In another comparative example, supposing that an error occurs causing a decrease in the output voltage from the DC/DC converter 11 at a predetermined target current of the constant-current circuit 21. As shown in FIG. 1C, control at the predetermined target current generates a term Tb causing the operation of the transistor M1 of the constant-current circuit 21 in the saturated region and the output current Iout contains a ripple component. Even in such a case, however, the bottom voltage controller 31 of the power supply device 1 according to the first embodiment decreases the target current in the constant-current circuit 21 and converges the bottom ripple voltage of the output voltage VLED− at the output terminal tb to the balanced voltage VD. The ON resistance of the transistor M1 in the constant-current circuit 21 is thereby controlled at a high level such that the output current Iout decreases, resulting in a reduction in the term Tb while the transistor M1 operates in the saturated region. As a result, the ripple component in the output current Iout is completely removed or flickering in an image taken with a digital camera is reduced to an undetectable level. Also, in this case, the light emitting diode 61 can be normally driven with reduced ripple in the output current Iout if the output power from the DC/DC converter 11 does not decrease to a level not causing the drive of the load as shown in FIG. 1A.

Second Embodiment

Figure 4:
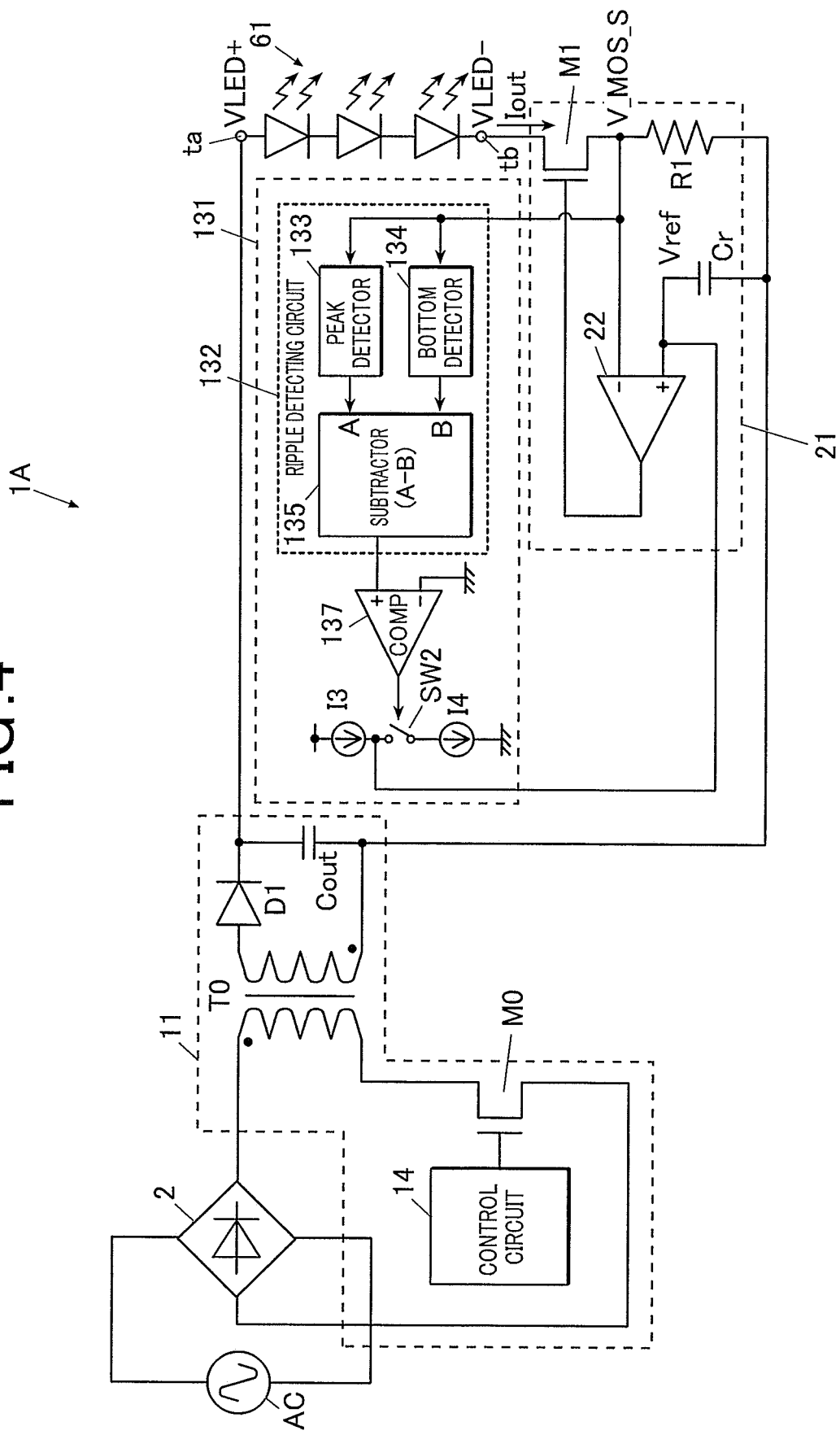
FIG. 4 is a circuit diagram illustrating a power supply device according to the second embodiment of the present invention.

FIG. 4 is a circuit diagram illustrating a power supply device according to the second embodiment of the present invention.

The power supply device 1A according to the second embodiment is mainly different from the first embodiment in the configuration of the bottom voltage controller 131, but is the same as the first embodiment in the configuration of other components. The following description will focus on the different components.

The bottom voltage controller 131 according to the second embodiment receives a voltage at the node between the transistor M1 of the constant-current circuit 21 and the current detecting resistor R1, in other words, the source voltage V_MOS_S of the transistor M1 as a detection voltage. The bottom voltage controller 131 raises or lowers the reference voltage Vref of the constant-current circuit 21 in response to the detection voltage to vary the current value flowing in the constant-current circuit 21 and thus to control the bottom voltage of the output voltage VLED− at the low potential side to the balanced voltage VD.

The bottom voltage controller 131 includes a ripple detecting circuit 132, a comparator 137, two current sources I3 and I4, and a switch SW2. The current source I3 corresponds to an example variation adder according to the present invention.

The ripple detecting circuit 132 receives the source voltage V_MOS_S converted from the output current Iout to detect the ripple component in the output current Iout. In detail, the ripple detecting circuit 132 includes a peak detector 133 detecting the peak voltage of the source voltage V_MOS_S, a bottom detector 134 detecting the bottom voltage of the source voltage V_MOS_S, and a subtractor 135 subtracting the detected value at the bottom detector 134 from the detected value at the subtractor 135. The peak detector 133 and the bottom detector 134 detect the peak voltage and bottom voltage, respectively, of the source voltage V_MOS_S, every cycle corresponding to the frequency of the alternating current power source AC. The peak detector 133 and the bottom detector 134 detect the peak voltage and the bottom voltage of the source voltage V_MOS_S after the removal of the noise component. The subtractor 135 subtracts the detected value at the bottom detector 134 from the detected value at the subtractor 135, and outputs the results to the comparator 137. In other words, if the output current Iout contains a ripple component exceeding a predetermined level, the subtractor 135 determines the difference between the peak voltage and the bottom voltage to be a positive value and outputs a positive voltage. In contrast, if the output current Iout does not contain a ripple component exceeding the predetermined level, the subtractor 135 does not output the positive voltage due to no difference between the peak voltage and the bottom voltage. The peak detector 133, the bottom detector 134, and the subtractor 135 may be integrated into a digital circuit that processes the digital source voltage V_MOS_S.

The comparator 137 compares the reference potential with the output from the subtractor 135, and turns on the switch SW2 in response to the reception of a positive voltage from the subtractor 135 or turns off the switch SW2 in other cases. The current source I3 always supplies a minute electric current to the capacitor Cr of the constant-current circuit 21 and gradually raises the reference voltage Vref of the constant-current circuit 21. The other current source I4 extracts the minute electric current from the capacitor Cr of the constant-current circuit 21 in the ON state of the switch SW2 to lower the reference voltage Vref of the constant-current circuit 21. The current value in the current source I4 is set to be a higher than that in the current source I3.

The bottom voltage controller 131, and the error amplifier 22 and transistor M1 of the constant-current circuit 21 in the power supply device 1A in FIG. 4 is integrated into a semiconductor integrated circuit fabricated in a single chip. Alternatively, the transistor M1 may be disposed outside of the semiconductor integrated circuit not inside of the semiconductor integrated circuit.

Explanation of Operation

In the power supply device 1A of the second embodiment, the DC voltage from the DC/DC converter 11 also contains a ripple component and the constant-current circuit 21 outputs the output current Iout controlled to the target current is outputted to the light emitting diode 61, like the first embodiment.

If the reference voltage Vref of the constant-current circuit 21 is varied at a constant rate while the bottom voltage controller 131 is being inactivated in the power supply device 1A of the second embodiment, the voltage and current vary at each component as shown in FIG. 3. In the range H1 where the reference voltage Vref is higher than the balanced voltage VD, the output current Iout contains a ripple component, whereas in the range H2 where the reference voltage Vref is lower than the balanced voltage VD, the loss occurring in the transistor M1 of the constant-current circuit 21 increases. The bottom voltage controller 131 according to the second embodiment varies the reference voltage Vref of the constant-current circuit 21 such that the bottom voltage of the output voltage VLED− converges to the balanced voltage VD based on the characteristics shown in FIG. 3.

The bottom voltage controller 131 instructs the current source I3 to add a variation to the reference voltage Vref of the constant-current circuit 21 such that the reference voltage Vref gradually increases. Since the output current Iout does not contain a ripple component in the case that the reference voltage Vref lies in the region H2 in FIG. 3, the detected value at the peak detector 133 equals the detected value at the bottom detector 134 in the ripple detecting circuit 132 and thus the subtractor 135 does not output a positive value. In such a case, no signal is outputted from the comparator 137 for closing the switch SW2, and thus the switch SW2 is still open. As a result, the reference voltage Vref increases by the effect of the current source I3, and the bottom voltage is shifted toward the balanced voltage VD.

If the reference voltage Vref lies in the range H1 in FIG. 3, the output current Iout contains a ripple component, and the detected value at the ripple detecting circuit 132 exceeds the detected value at the bottom detector 134 in the peak detector 133, resulting in positive output from the subtractor 135. In such a case, the comparator 137 outputs a signal to close the switch SW2. As a result, the current source I4 extracts a current from the capacitor Cr to lower the reference voltage Vref and to shift the bottom voltage toward the balanced voltage VD. Such an operation causes convergent of the bottom ripple voltage of the output voltage VLED− at the low potential side to the balanced voltage VD.

As described above, the power supply device 1A according to the second embodiment generates a DC voltage from the alternating current power source AC with a reduction in generation of harmonic waves. The ripple component, if generated, in the output current Iout to be outputted to the load can be reduced to a sufficiently low level through the control of the constant-current circuit 21. The light from light emitting diode 61 thereby does not flicker.

In the power supply device 1A according to the second embodiment, the bottom voltage controller 131 converges the bottom voltage of the output voltage VLED− at the low potential side to the balanced voltage VD. As a result, the ripple component in the output current Iout can be reduced and the loss in the transistor M1 of the constant-current circuit 21 can be reduced by the same effect explained in the first embodiment.

Third Embodiment

Figure 5:
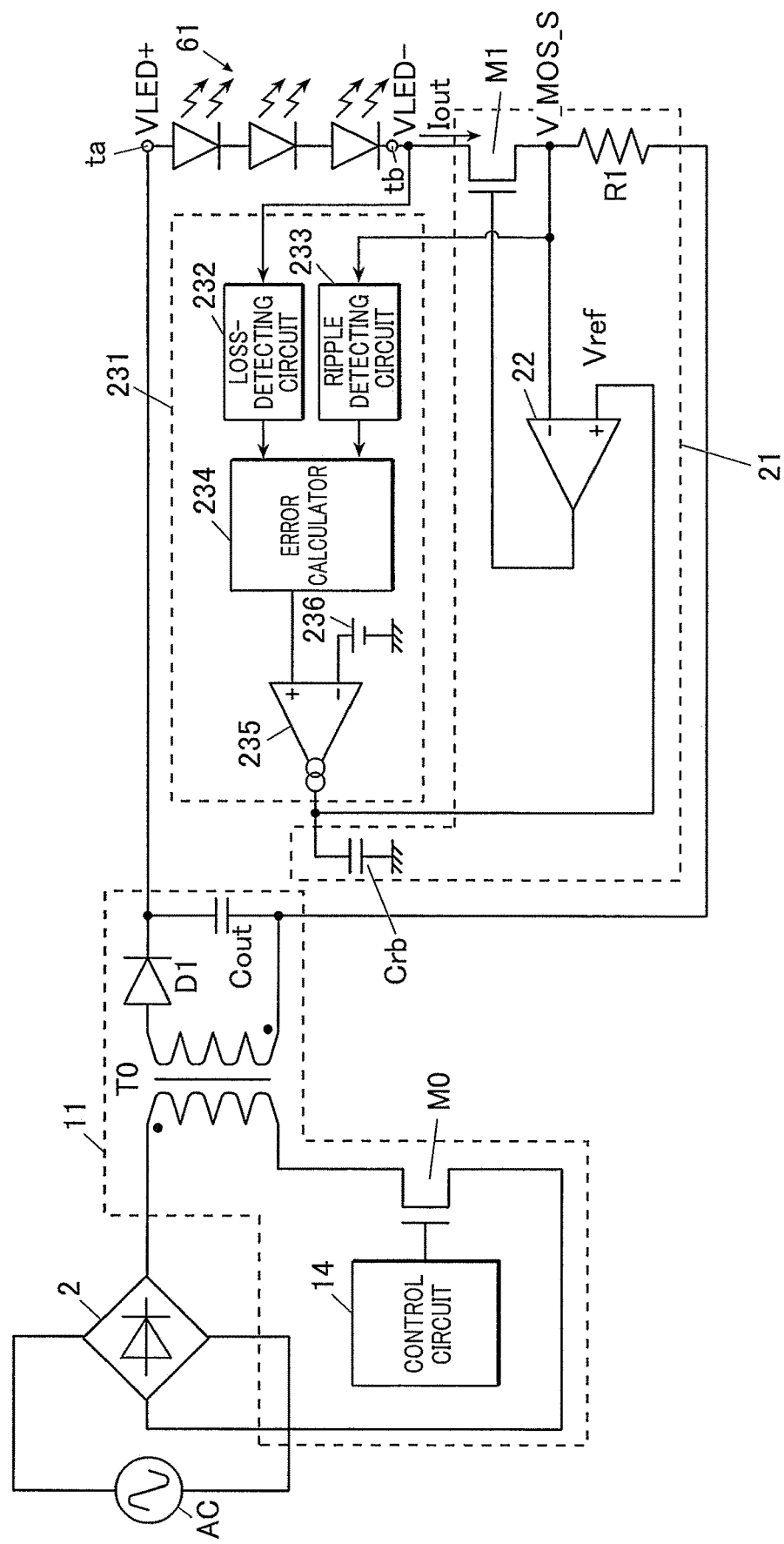
FIG. 5 is a circuit diagram illustrating a power supply device according to the third embodiment of the present invention.

FIG. 5 is a circuit diagram illustrating a power supply device according to the third embodiment of the present invention.

The power supply device 1B according to the third embodiment is mainly different from the first and second embodiments in the configuration of the bottom voltage controller 231, but the same as the first and second embodiments in the configuration of other components. The following description will focus on the different components.

The constant-current circuit 21 of the third embodiment includes a capacitor Crb having a terminal connected to the reference potential. The capacitor Crb is a device supplying the reference voltage Vref.

The bottom voltage controller 231 of the third embodiment includes a loss detecting circuit 232, a ripple detecting circuit 233, an error calculator 234, a current amplifier 235, and a voltage source 236.

The loss detecting circuit 232, which is similar to the loss-detecting circuit 32 of the first embodiment, outputs a voltage corresponding to a variation in the bottom voltage of the output voltage VLED−.

The ripple-detecting circuit 233, which is similar to the ripple detecting circuit 132 of the second embodiment, outputs a current corresponding to, the ripple value of the output current Iout.

The error calculator 234 subtracts the output value of the ripple-detecting circuit 233 from the output value of the loss-detecting circuit 32 and outputs the resulting voltage to the non-inverting input terminal of the current amplifier 235.

The current amplifier 235 receives a predetermined positive voltage at the inverting input terminal receives from the voltage source 236 and a voltage corresponding to the calculated result at the non-inverting input terminal receives from the error calculator 234 and outputs a current corresponding to the difference in voltage to the capacitor Crb. The positive voltage to be inputted from the inverting input terminal is set to be low. If the error calculator 234 outputs no voltage, the current amplifier 235 outputs a minute negative current, in other words, receives a minute current from the capacitor Crb. As a result, the reference voltage Vref of the constant-current circuit 21 lowers.

In the power supply device 1B in FIG. 5, the bottom voltage controller 231 and the error amplifier 22 and transistor M1 of the constant-current circuit 21 are disposed in a semiconductor integrated circuit fabricated in a single chip. Alternatively, the transistor M1 may be disposed outside of the semiconductor integrated circuit not inside of the semiconductor integrated circuit.

Explanation of Operation

In the power supply device 1B of the third embodiment, the DC voltage from the DC/DC converter 11 also contains a ripple component and the constant-current circuit 21 outputs the output current Iout controlled to the target current to the light emitting diode 61, like the second embodiment.

If the reference voltage Vref of the constant-current circuit 21 is varied at a constant rate while the bottom voltage controller 231 is being inactivated in the power supply device 1B of the third embodiment, the voltage and current vary at each component as shown in FIG. 3. In the range H1 where the reference voltage Vref is higher than the balanced voltage VR, the output current Iout contains a ripple component, whereas in the range H2 where the reference voltage Vref is lower than the balanced voltage VR, the loss occurring in the transistor M1 of the constant-current circuit 21 increases. The bottom voltage controller 231 according to the third embodiment varies the reference voltage Vref of the constant-current circuit 21 such that the bottom voltage of the output voltage VLED− converges to the balanced voltage VD based on the characteristics shown in FIG. 3.

In the bottom voltage controller 231, the output from the ripple-detecting circuit 233 has a positive value and the output from the loss-detecting circuit 232 is substantially zero at the reference voltage Vref within the range H1 in FIG. 3. Hence, the error calculator 234 outputs a negative value. This leads to output of a negative current from the current amplifier 235 and extraction of a current from the capacitor Crb, resulting in a decrease in reference voltage Vref. As a result, the bottom voltage of the output voltage VLED− at the low potential side shifts toward the balanced voltage VD.

If the reference voltage Vref shifts from the range H1 to the range H2 in FIG. 3, the output from the ripple-detecting circuit 233 is substantially zero and thus the output from the loss-detecting circuit 232 has a positive value, resulting in positive output from the error calculator 234. The current amplifier 235 thereby outputs a positive current to the capacitor Crb, resulting in an increase in reference voltage Vref. The bottom voltage of the output voltage VLED− at the low potential side shifts toward the balanced voltage VD. Such an operation causes the bottom voltage of the output voltage VLED− to converge to the balanced voltage VD.

If the reference voltage Vref is stabilized at a certain value within the range H2 in FIG. 3, the positive voltage at the inverting input terminal of the current amplifier 235 varies the voltage of the capacitor Crb (reference voltage Vref). As a result, the reference voltage Vref is not stable at this value within the range H2 for a long time and thus the bottom voltage of the output voltage VLED− at the low potential side converges to the balanced voltage VD.

As described above, the power supply device 1B according to the third embodiment generates a DC voltage from the alternating current power source AC with a reduction in generation of harmonic waves. The ripple, if generated, in the output current Iout to be outputted to the load can be reduced to a sufficiently low level through the control of the constant-current circuit 21. The light from light emitting diode 61 thereby does not flicker.

In the power supply device 13 according to the third embodiment, the bottom voltage controller 231 converges the bottom voltage of the output voltage VLED− at the low potential side to the balanced voltage VD. As a result, the ripple component in the output current Iout can be reduced and the loss in the transistor M1 of the constant-current circuit 21 can be reduced by the same effect explained in the first embodiment.

Fourth Embodiment

Figure 6:
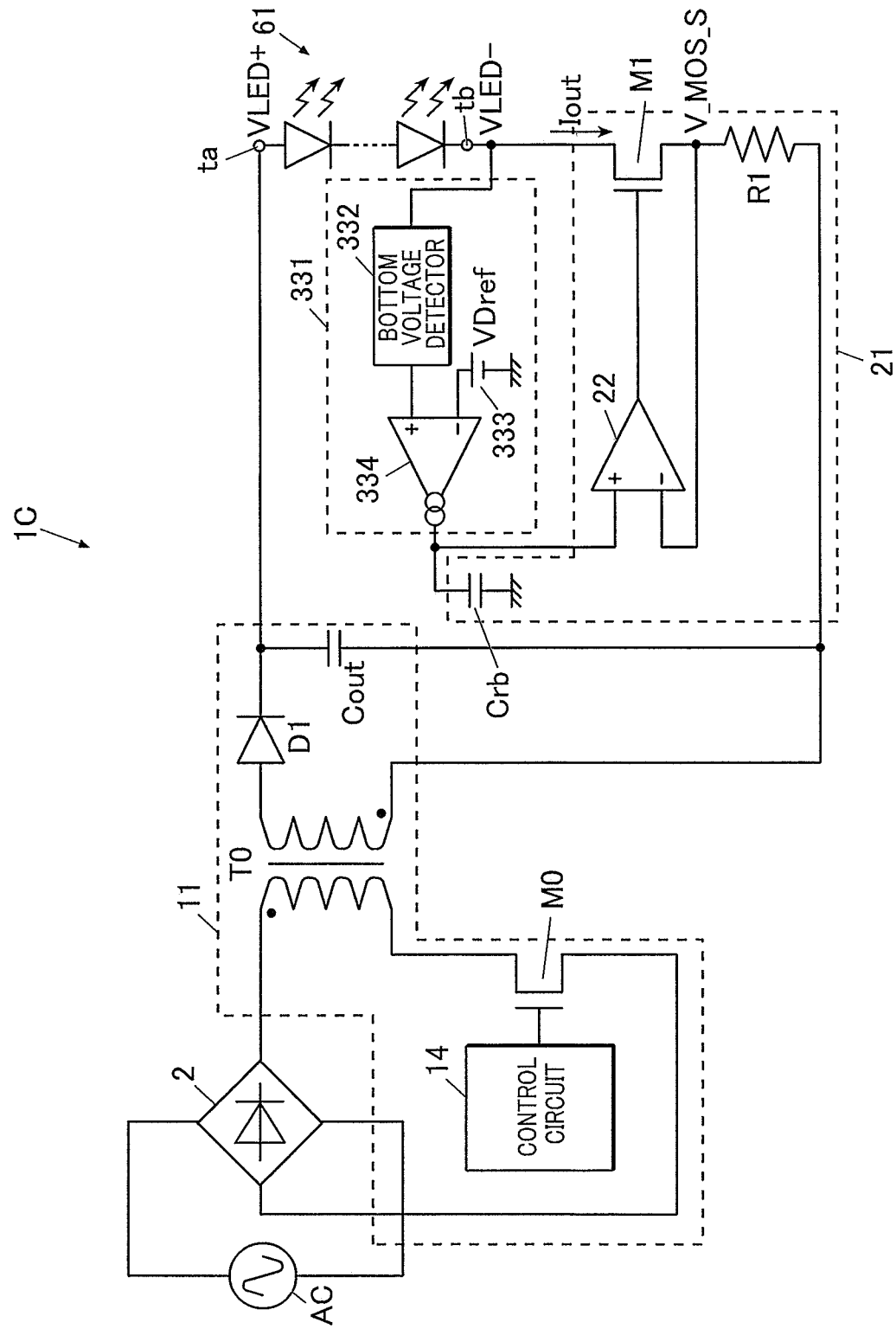
FIG. 6 is a circuit diagram illustrating a power supply device according to the fourth embodiment of the present invention.

FIG. 6 is a circuit diagram illustrating a power supply device according to the fourth embodiment of the present invention.

The power supply device 1C according to the fourth embodiment is mainly different from the third embodiment in the configuration of the bottom voltage controller 331, but is the same as the third embodiment in the configuration of other components. The following description will focus on the different components.

The bottom voltage controller 331 of the fourth embodiment controls the bottom voltage of the output voltage VLED− at the low potential side such that the bottom voltage converges to the balanced voltage VD, which is preliminarily set to a fixed value. The balanced voltage VD is preliminarily calculated in view of the magnitude of the load connected to the power supply device 1C and the operational environment and is set in the bottom voltage controller 331. The bottom voltage controller 331 includes a bottom voltage detector 332 detecting and holding the bottom voltage of the output voltage VLED− at the low potential side, a reference circuit 333 generating a reference voltage VDref, and a current amplifier 334 supplying or extracting current to or form the capacitor Crb of the constant-current circuit 21. The reference voltage VDref is designed to equal the calculated balanced voltage VD.

In the power supply device 1C in FIG. 6, the bottom voltage controller 331 and the error amplifier 22 and transistor M1 of the constant-current circuit 21 are disposed in a semiconductor integrated circuit fabricated in a single chip. Alternatively, the transistor M1 may be disposed outside of the semiconductor integrated circuit not inside of the semiconductor integrated circuit.

Explanation of Operation

The bottom voltage detector 332 of the bottom voltage controller 331 detects and holds the bottom voltage of the output voltage VLED− every cycle in the ripple waveform. The cycle in the ripple waveform depends on, for example, the frequency of the alternating current power source AC. The current amplifier 334 outputs a current corresponding to a differential voltage between the held bottom voltage and the reference voltage VDref to the capacitor Crb. A current thereby flows to or from the capacitor Crb to raise or lower the reference voltage Vref of the constant-current circuit 21 and thus to increase or decrease the output current Iout. As a result, the bottom voltage of the output voltage VLED− converges to the balanced voltage VD.

Figure 7A:
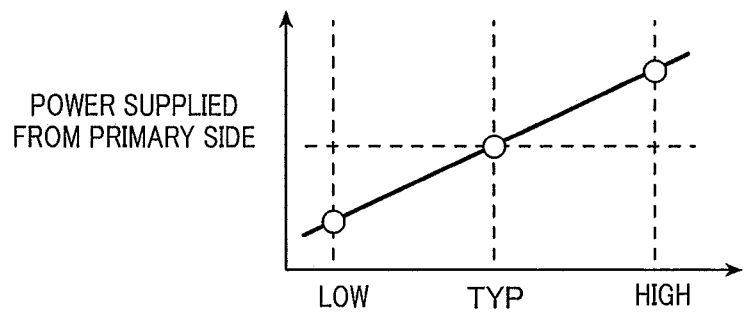
FIG. 7A illustrates a variation in supplied power from a primary side in the operation of bottom voltage control in the fourth embodiment.
Figure 7B:
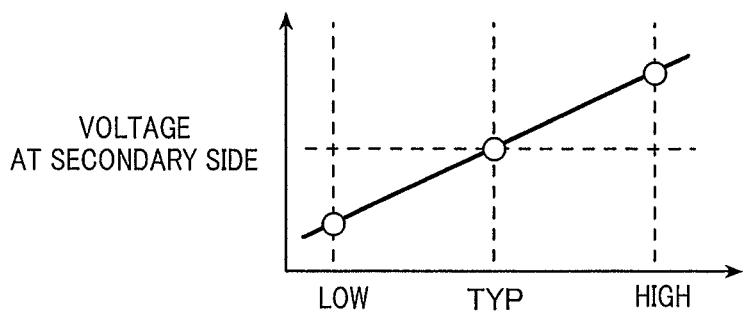
FIG. 7B illustrates a variation in voltage at a secondary side in the operation of bottom voltage control in the fourth embodiment.
Figure 7C:
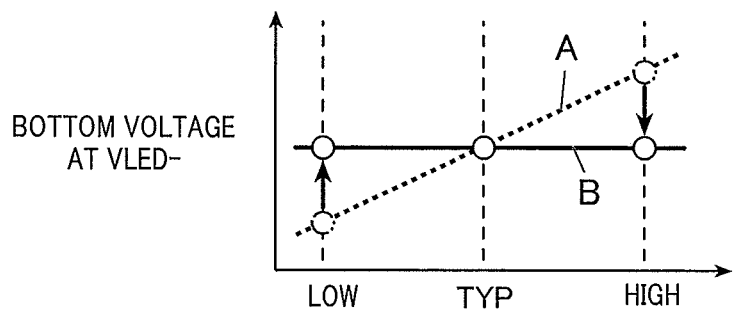
FIG. 7C illustrates a variation in bottom output voltage at a cathode side in the operation of bottom voltage control in the fourth embodiment.
Figure 7D:
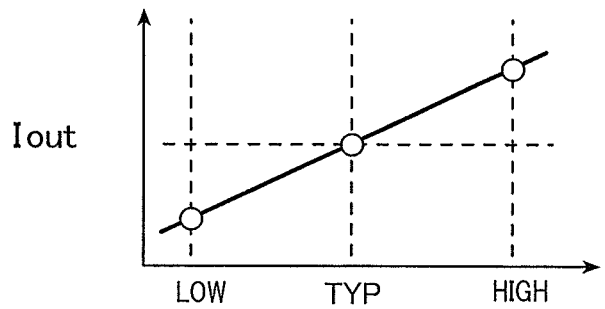
FIG. 7D illustrates a variation in output current in the operation of bottom voltage control in the fourth embodiment.

FIGS. 7A to 7D illustrate the operation of bottom voltage control in the fourth embodiment. FIG. 7A illustrates a variation in supplied power from a primary side. FIG. 7B illustrates a variation in voltage at a secondary side. FIG. 7C illustrates a variation in bottom output voltage at a low-voltage side. FIG. 7D illustrates a variation in output current.

Supposing that a variable error occurs in the circuit of the power supply device 10 of the fourth embodiment as shown in FIG. 7A, where the power supplied from the primary side of the transformer T0 increases or decreases from the standard value TYP. In this case, the DC voltage transmitted to the secondary side of the transformer T0 also increases or decreases as shown in FIG. 7B.

Figure 10:
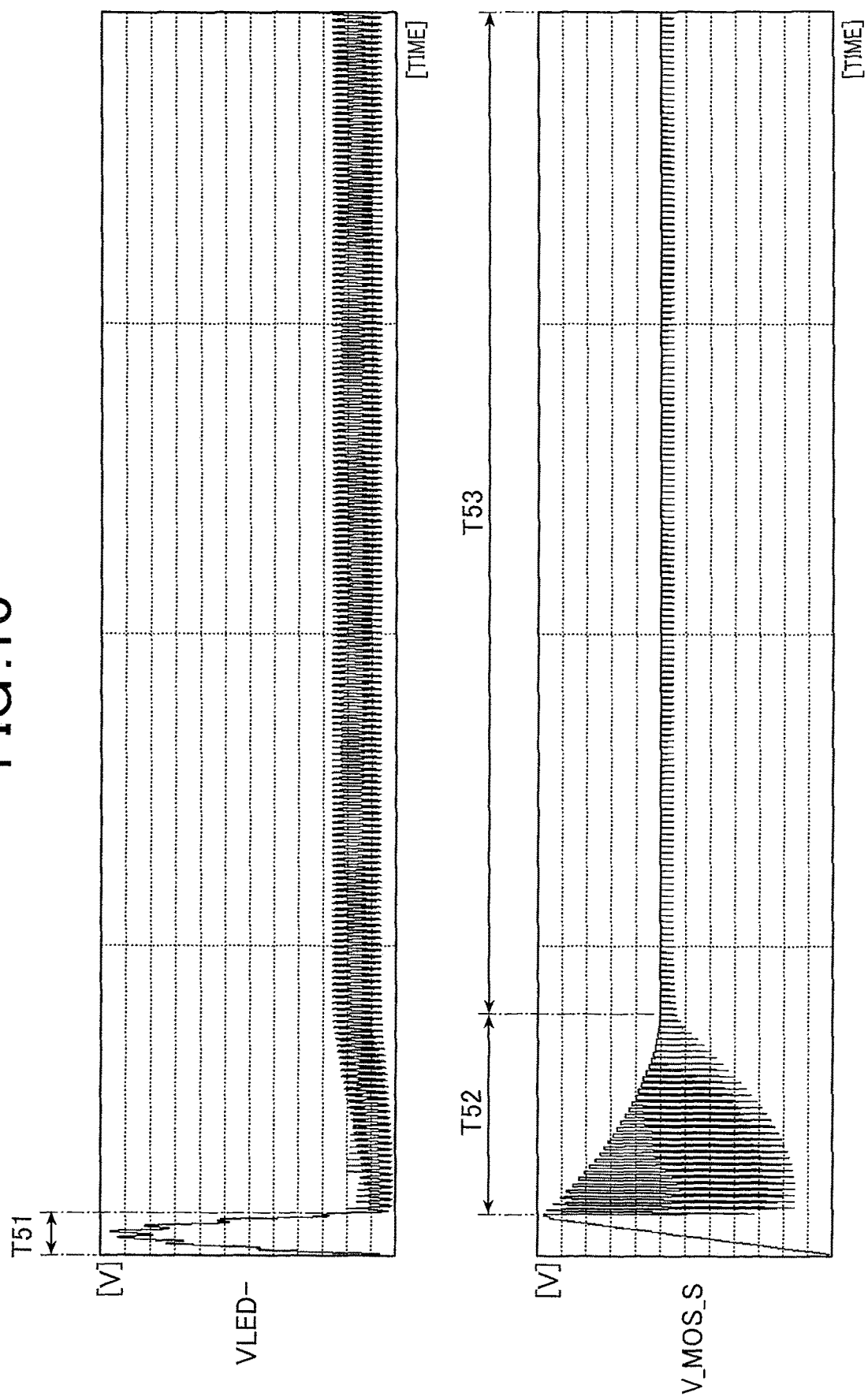
FIG. 10 includes signal waveform diagrams illustrating the control operation in a power supply device of the sixth embodiment.

If the bottom voltage controller 331 is not active, the bottom voltage of the output voltage VLED− at the low potential side increases or decreases in response to a variation in the output voltage VLED+ at the high potential side as shown in the characteristic line A in FIG. 7C. Since the output current Iout has a constant value under the control of the constant current control, the loss in the transistor M1 increases (if the power increases) or the transistor M1 cannot absorb the ripple component, resulting in an output current Iout containing the ripple component (if the power decreases), as shown in FIGS. 1B and 10, respectively.

In the power supply device 1C of the fourth embodiment, however, the bottom voltage controller 331 controls the bottom voltage of the output voltage VLED− at the low potential side to the balanced voltage VD as shown in the characteristic line B in FIG. 7C. The current controlled by the constant-current circuit 21 increases or decreases, and the output current Iout increases or decreases in response to the variation in the output current Iout as shown in FIG. 7D. The current flowing into the light emitting diode 61 thereby varies in response to a variation in the supplied electric power. Furthermore, the current controlled by the constant-current circuit 21 is maintained at a proper value. If the supplied power increases, the ON resistance of the transistor M1 decreases, resulting in a reduction in loss in the transistor M1. If the supplied power decreases, the ON resistance of the transistor M1 increases, resulting in a reduction in ripple component in the output current Iout.

Supposing that the capacitance of the output capacitor Cout in the DC/DC converter 11 decreases due to, for example, age-related degradation to increase the ripple component in the converted DC voltage. If the output current Iout has a predetermined value without control by the bottom voltage controller 331, the output current Iout may contain the ripple component. The bottom voltage controller 331, however, controls the bottom voltage to a constant value. Hence, the output current Iout decreases due to an increase in the ON resistance of the M1, resulting in a reduction in ripple component in the output current Iout.

As described above, the power supply device 1C according to the fourth embodiment generates a DC voltage from the alternating current power source AC with a reduction in generation of harmonic waves. The ripple, if generated, in the output current Iout to be outputted to the load can be reduced to a sufficiently low level through the control of the constant-current circuit 21. Furthermore, the bottom voltage controller 331 maintains the bottom voltage of the output voltage VLED− at the low potential side at the balanced voltage VD. Hence the loss occurring in the transistor M1 of the constant-current circuit 21 can be reduced while the ripple component in the output current Iout is reduced.

Fifth Embodiment

Figure 8:
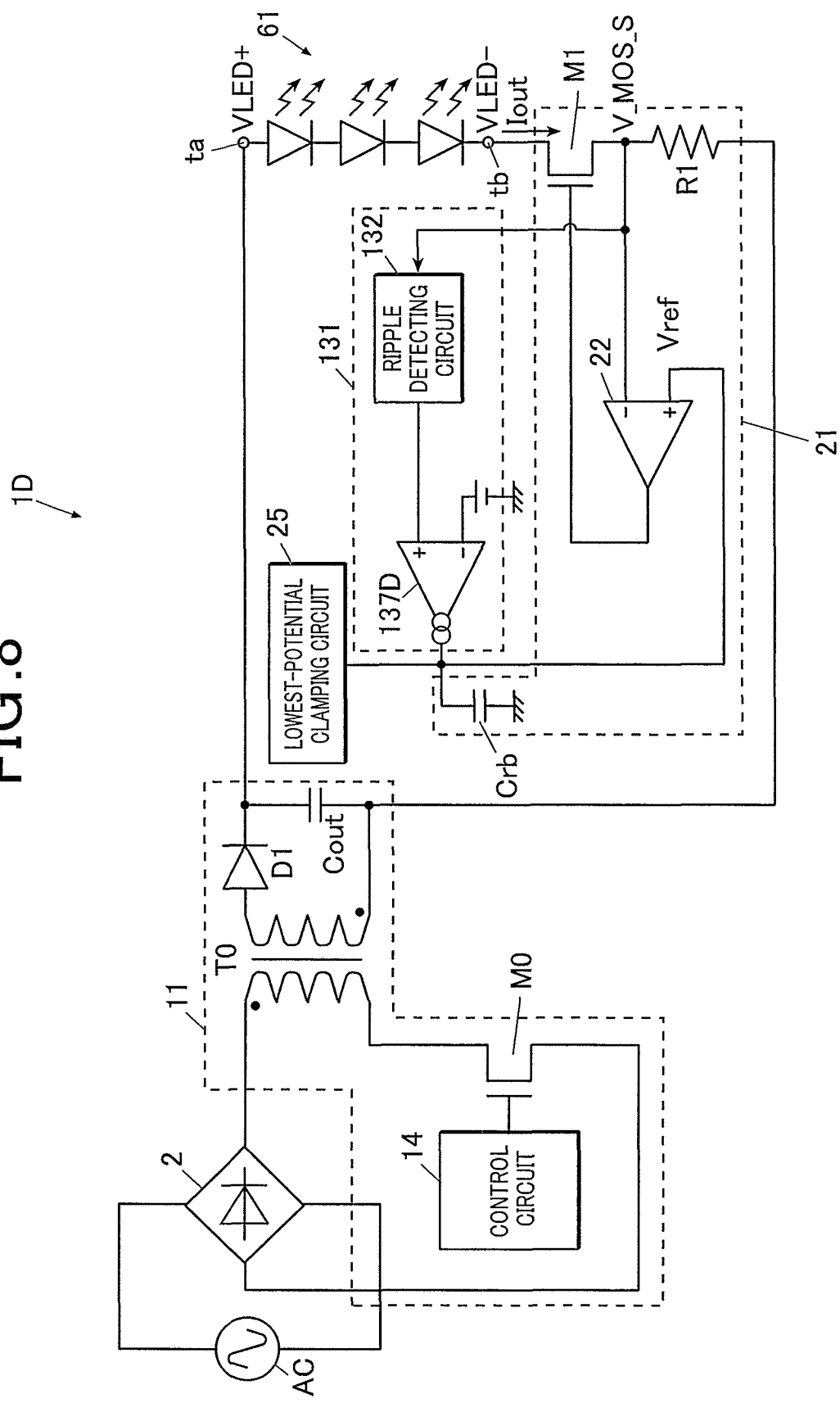
FIG. 8 is a circuit diagram illustrating a power supply device according to the fifth embodiment of the present invention.

FIG. 8 is a circuit diagram illustrating a power supply device according to the fifth embodiment of the present invention.

The power supply device 1D of the fifth embodiment has a configuration of the power supply device 1A of the second embodiment further provided with a lowest-potential clamping circuit 25.

In the power supply device 1A of the second embodiment, the current to or from the capacitor Cr is controlled using the two current sources I3 and I4 and the switch SW2 to modify the reference voltage Vref. In contrast, in the power supply device 1D shown in FIG. 8, the current to or from the capacitor Crb is controlled using the output from the positive current or negative current of the comparator 137D to modify the reference voltage Vref. Despite the difference between these configurations, the effect of the result detected at the ripple detecting circuit 132 on the reference voltage Vref is the same.

The lowest-potential clamping circuit 25 clamps the reference voltage Vref such that the reference voltage Vref does not decrease to a level below a predetermined minimum value even if the bottom voltage controller 131 controls the reference voltage Vref such that the reference voltage Vref of the constant-current circuit 21 does not lower. The lowest-potential clamping circuit 25 may be disposed together with the bottom voltage controller 131 into a single semiconductor integrated circuit.

In the case that the capacitance of the output capacitor Cout in the DC/DC converter 11 decreases due to, for example, age-related degradation, the ripple component increases in the converted DC voltage. In the power supply devices 1 to 1B of the first to third embodiments, the bottom voltage controllers 31, 131, and 231 illimitably modify the reference voltage Vref of the constant-current circuit 21 to a small value in order to remove the ripple component of the output current Iout. As a result, the transistor M1 consumes a large amount of power, resulting in an increase in heat generation.

In the power supply device 1D of the fifth embodiment, the lowest-potential clamping circuit 25 clamps the reference voltage Vref such that the reference voltage Vref does not lower to a level below the predetermined potential even if the bottom voltage controller 131 decreases the reference voltage Vref. Even if the heatproof temperature of the transistor M1 or its environment is low, the heat generation of the transistor M1 can be reduced so as not to exceed the heatproof temperature. Incorporation of the lowest-potential clamping circuit 25 of the first to third embodiments to the power supply devices 1 to 1B achieves the same advantageous effects as that of the first to third embodiments.

Sixth Embodiment

Figure 9:
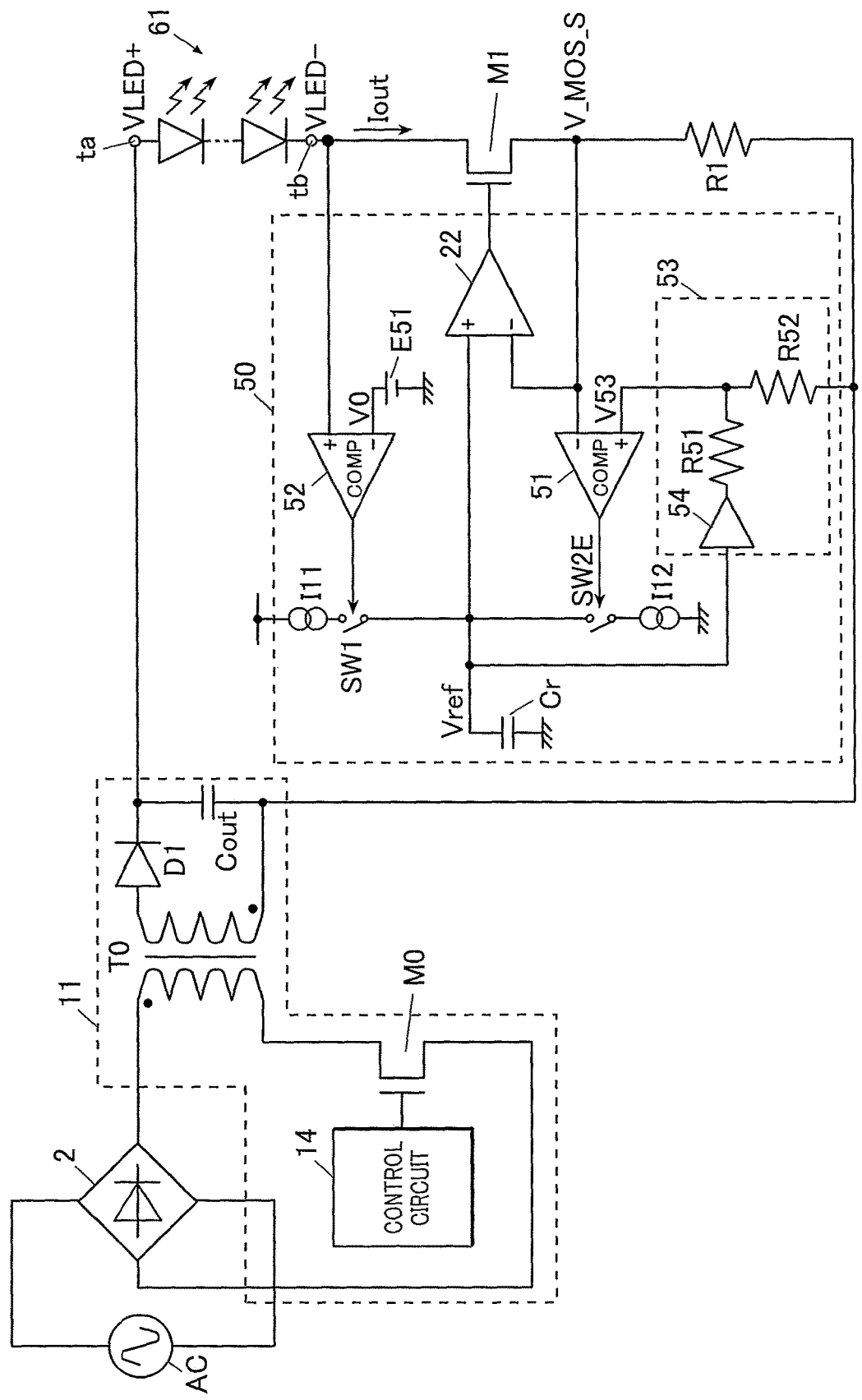
FIG. 9 is a circuit diagram illustrating a power supply device according to the sixth embodiment of the present invention.

FIG. 9 is a circuit diagram illustrating a power supply device according to the sixth embodiment of the present invention. The power supply device 1E according to the sixth embodiment includes a rectifier circuit 2, a DC/DC converter 11, a transistor M1, which is a current controller, a current detecting resistor R1, and a current-controlling circuit 50. The power supply device 1E is connected to a light emitting diode 61 as a load between the output terminals ta and tb. The same reference numerals are assigned to the same elements as that in the first embodiment without redundant description.

The current-controlling circuit 50 drives the transistor M1 such that the difference between the reference voltage Vref and the source voltage V_MOS_S (current detecting voltage) decreases to control the output current Iout. The current-controlling circuit 50 controls the reference voltage Vref so as to suppress the ripple component in the output current Iout and reduce the loss in the transistor M1 based on the output voltage VLED− containing the ripple component in the DC/DC converter 11 and the source voltage V_MOS_S (current detecting voltage) indicating the magnitude of the output current.

In detail, the current-controlling circuit 50 includes a capacitor Cr holding the reference voltage Vref and an error amplifier 22 outputting a drive signal to the transistor M1 so as to reduce the difference between the reference voltage Vref and the source voltage V_MOS_S (current detecting voltage). The current-controlling circuit 50 further includes a first current source I11 and a switch SW1 that can raise the reference voltage Vref held in the capacitor Cr (corresponding to a first raising circuit) and a second current source I12 and a switch SW2E that can lower the reference voltage Vref held in the capacitor Cr (corresponding to a reducing circuit). The current-controlling circuit 50 further includes a circuit E51 generating the reference voltage V0, a voltage divider circuit 53 including a buffer 54 and voltage driving resistors R51 and R52, a first comparator 51, and a second comparator 52.

The first comparator 51 compares the divided voltage V53 generated in the voltage divider circuit 53 with the source voltage V_MOS_S. If the divided voltage V53 is lower than the source voltage V_MOS_S, the switch SW2 is turned on to lower the reference voltage Vref. The second comparator 52 compares the reference voltage V0 with the output voltage VLED− If the output voltage VLED− is higher than the reference voltage V0, the switch SW1 is turned on to raise the reference voltage Vref The voltage divider circuit 53 generates a divided voltage V53 generated at a predetermined division ratio from the reference voltage Vref. The division ratio is set to 1−x, where x is the ratio of the allowable ripple current to the upper limit of the output current Iout. In the case where 10% of ripple is allowed in the specification of a lighting device as a load, the division ratio is 90%. The first comparator 51 thereby operates to turn on the switch SW2E if the ripple component contained in the output current Iout exceeds the allowable rate.

The reference voltage V0 is preliminarily set at a voltage higher than the output voltage VLED− where the ripple component in the output current Iout is zero. At the same time, the reference voltage V0 is set at a voltage below a predetermined voltage. For example, in the case that the DC/DC converter 11 can vary the output power with a light modulator, the output voltage VLED− increases immediately after the output power is significantly varied. In such a case, the reference voltage V0 is set at a value lower than the raised voltage. Such setting enables the second comparator 52 operates to turn on the switch SW1 if the output power is modified with the light modulates.

The current source I11 has a voltage raising ability that is (for example, two times) higher than the voltage lowering ability of the current source I12. In other words, the current supplied by the current source I11 per unit time is greater than the current extracted by the current source I12. The reference voltage Vref increasing when the switch SW1 is turned on is large whereas the reference voltage Vref decreasing when the switch SW2 is turned on is small.

In the power supply device 1E shown in FIG. 9, the current-controlling circuit 50, the transistor M1, and the current detecting resistor R1 are provided in a semiconductor integrated circuit fabricated in a single chip. Alternatively, part or all of the transistor M1, the R1, and the voltage dividing resistors R51 and R52 may be disposed outside of the semiconductor integrated circuit not inside of the semiconductor integrated circuit.

Explanation of Operation

Figure 11:
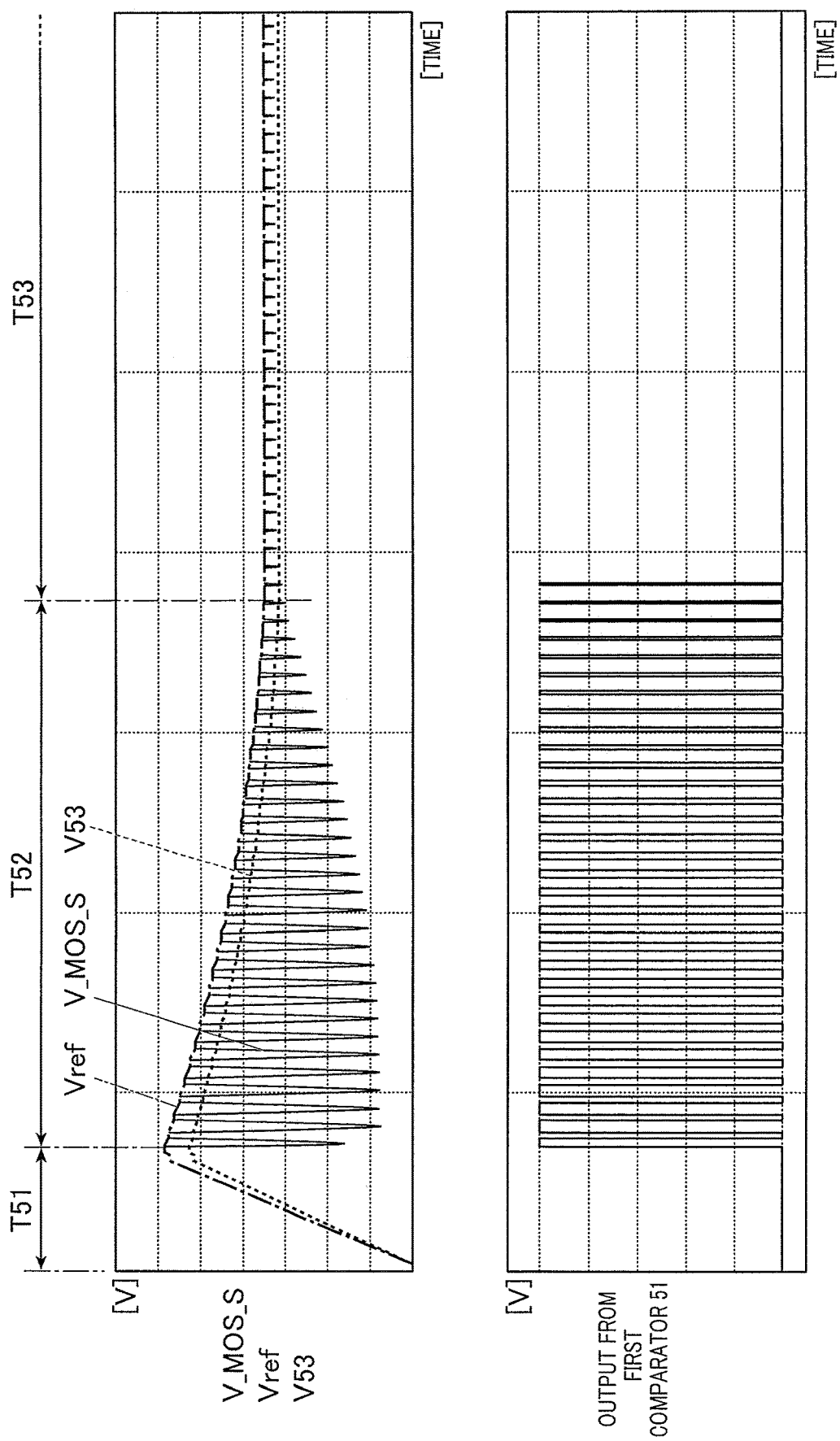
FIG. 11 includes signal waveform diagrams illustrating the control operation of a first comparator.
Figure 12:
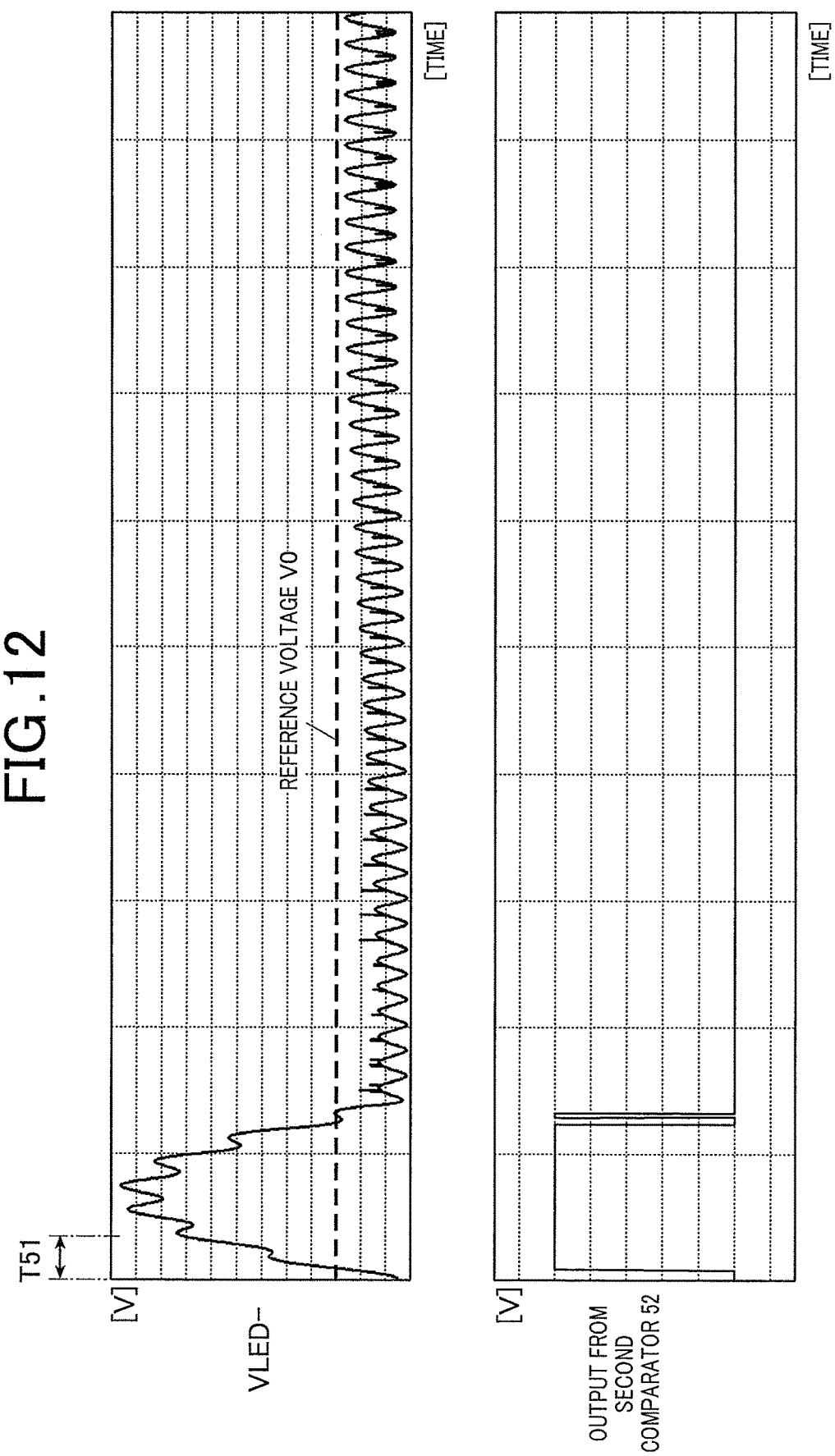
FIG. 12 includes signal waveform diagrams illustrating the control operation of a second comparator.

FIG. 10 includes signal waveform diagrams illustrating the control operation in a power supply device of the sixth embodiment. FIG. 11 includes signal waveform diagrams illustrating the control operation of a first comparator. FIG. 12 includes signal waveform diagrams illustrating the control operation of a second comparator.

In the power supply devices 1 to 1C of the first to fourth embodiments, the transistor M1 is controlled based on a variation in the bottom voltage of the output voltage VLED− such that the states of the power supply devices 1 to 1D converge to a boundary between the range H1 and the range H2 in FIG. 3. In contrast, in the power supply device 1E of the sixth embodiment, the control of the transistor M1 is fixed when the ripple component slightly remains (for example, 10% ripple remains) in the source voltage V_MOS_S indicating the magnitude of the output current Iout. The state of the power supply device 1E is thereby controlled so as to converge to a boundary or its vicinity between the range H1 and the range H2. In other words, the bottom voltage of the output voltage VLED− converges to the balanced voltage VD within the range where the ripple component in the output current Iout is reduced to, for example, 10%.

If the output power from the DC/DC converter 11 is increased by the start-up of the power supply device 1E or light modulation, the output capacity of the DC/DC converter 11 becomes larger than the current flowing in the transistor M1 (reference voltage Vref) and thus output voltage VLED− increases (term T51 in FIGS. 10 and 12). The second comparator 52 compares the output voltage VLED− with the reference voltage V0. With reference to FIG. 12, the output voltage VLED− exceeds the reference voltage V0 in the term T51. Hence, the output from the second comparator 52 is at a high level. The first current source I11 thereby raises the reference voltage Vref. Such raising causes the power supply device 1E to shift from the state of the range H2 to the state of the range H1 in FIG. 3 (the state where the ripple occurs in the output current Iout).

Since the first current source I11 has high capacity, the reference voltage Vref can promptly rise.

If the reference voltage Vref increases in proportion to the output from the DC/DC converter 11 at a current flowing in the transistor M1 larger than the output capacity from the DC/DC converter 11, ripple occurs in the output current Iout and the source voltage V_MOS_S (term T52). With reference to FIG. 11, the first comparator 51 compares the source voltage V_MOS_S with the divided voltage V53. For example, the divided voltage V53 is set at 90% of the reference voltage Vref. If the ripple component exceeds, for example, 10% of the top voltage of the source voltage V_MOS_S, the output from the first comparator 51 is at a high level. In other words, the first comparator 51 detects at least 10% ripple component. Such detection causes the second current source I12 to decrease gradually.

If the reference voltage Vref decreases, the current flowing in the transistor M1 balances to the output capacity of the DC/DC converter 11 to decrease the ripple component in the source voltage V_MOS_S. In other words, the state of the power supply device 1E shifts from the left of the range H1 toward the boundary to the range H2 in FIG. 3. Since the source voltage V_MOS_S does not fall below the divided voltage V53 at a rate of the ripple component below 10%, the output from the first comparator 51 is maintained at a low level (term T53, FIG. 11). The power supply device 1E is in a state where the output current Iout contains a slight ripple component at the boundary or its vicinity between the range H1 and the range H2 in FIG. 3.

In this state, the outputs from the first comparators 51 and 52 are both at low levels, and the reference voltage Vref is fixed to maintain the state of the power supply device 1E. The ripple component in the output current Iout is accordingly reduced while the minimized loss in the transistor M1 is maintained.

As described above, the power supply device 1E of the sixth embodiment includes the second comparator 52, and the first current source I11 and the switch SW1 increasing the reference voltage Vref in response to the comparison by the second comparator 52. At the startup of the power supply device 1E or at an increase in output capacity by light modulation, the reference voltage Vref can be raised to shift the state of the power supply device 1E to the state of the range H1 (FIG. 3) where a ripple component occurs in the output current Iout. The power supply device 1E of the sixth embodiment further includes the first comparator 51 comparing the divided voltage V53 of the reference voltage Vref with the source voltage V_MOS_S, and the second current source I12 and the switch SW2E decreasing the reference voltage Vref in response to the comparison by the first comparator 51. This configuration can converge the ripple component to a predetermined level even if the ripple component in the output current Iout increases. Since the first comparator 51 completes the decrease in the reference voltage Vref while the ripple component slightly remains, the state of the power supply device 1E is not shifted until the range H2 (FIG. 3) where a large loss occurs in the transistor M1 at no ripple component. Such a control operation can suppress the ripple component in the output current Iout and minimize the loss in the transistor M1.

In the power supply device 1E of the sixth embodiment, the capacity of the first current source I11 is set to be higher than that of the second current source I12. The reference voltage Vref can be promptly raised at the startup of the power supply device 1E or at an increase in output capacity by light modulation. The reference voltage Vref can be gradually decreased to an appropriate value when the ripple component in the output current Iout converges to a predetermined range.

Seventh Embodiment

Figure 13:
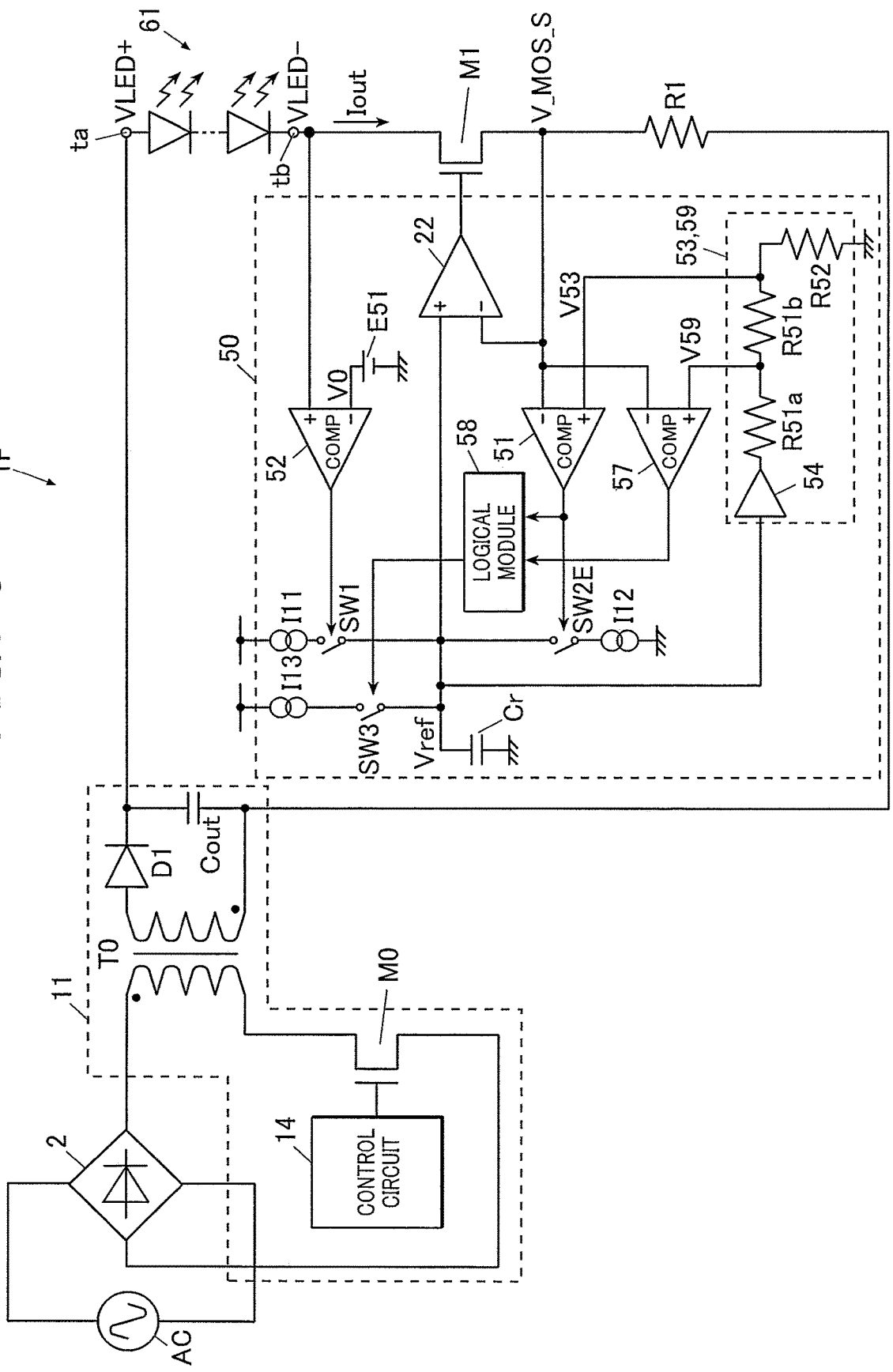
FIG. 13 is a circuit diagram illustrating a power supply device according to the seventh embodiment of the present invention.

FIG. 13 is a circuit diagram illustrating a power supply device according to the seventh embodiment of the present invention. The power supply device 1F of the seventh embodiment further includes elements generating a second divided voltage V59 (voltage dividing resistors R51a and R51b), a third comparator 57, a logical module 58, a third current source I13, and a switch SW3 corresponding to a second raising circuit, in addition to the components of the sixth embodiment. The same components as that in the sixth embodiment are denoted by the same reference numbers, without redundant explanation.

The third current source I13 and the switch SW3 supply a current to the capacitor Cr to raise the reference voltage Vref held in the capacitor Cr. The voltage-raising capacity of the third current source I13 is lower than (for example, less than half) the voltage-raising capacity of the current source 112. In other words, the current extracted by the current source I12 per unit time is greater than the current supplied by the current source I13. The increment in the reference voltage Vref when the switch SW3 is turned on is accordingly lower than the decrement in the reference voltage Vref when the switch SW2E is turned on.

A second divider circuit 59 generates a second divided voltage V59 generated at a predetermined division ratio from the reference voltage Vref. The division ratio of the second divided voltage V59 is set to be greater than the division ratio of the divided voltage V53. For example, the division ratio of the divided voltage V53 is set at 90% whereas the division ratio of the second divided voltage V59 is set at 95%.

The third comparator 57 compares the second divided voltage V59 with the source voltage V_MOS_S and outputs a high-level signal if the source voltage V_MOS_S falls below the second divided voltage V59.

Figure 14:
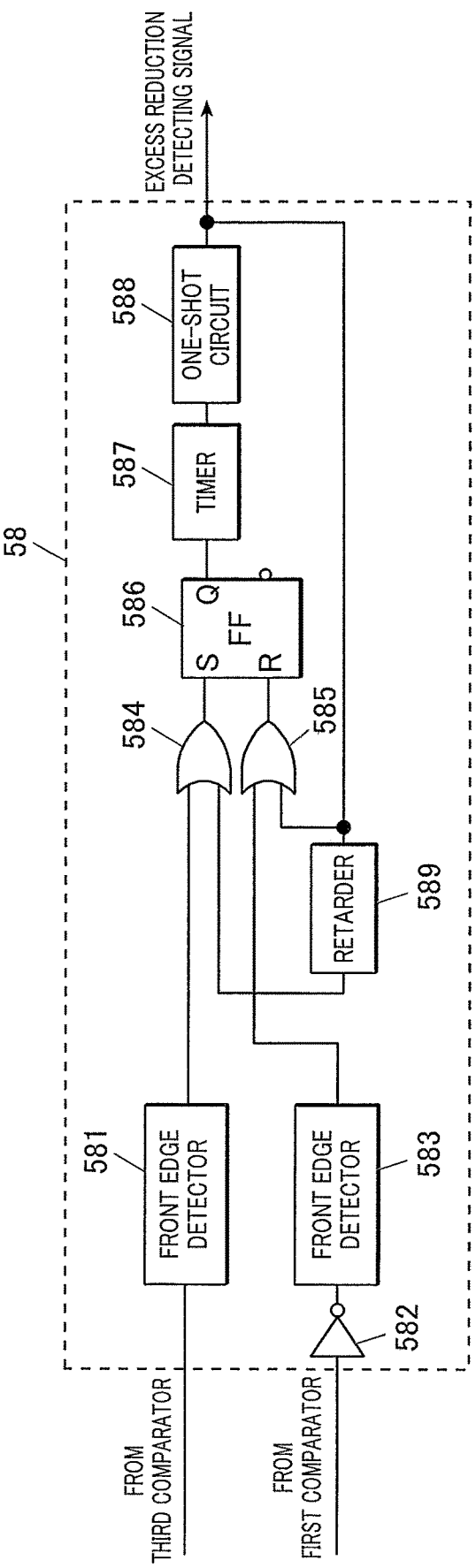
FIG. 14 is a circuit diagram illustrating an example logical module in FIG. 13.
Figure 15:
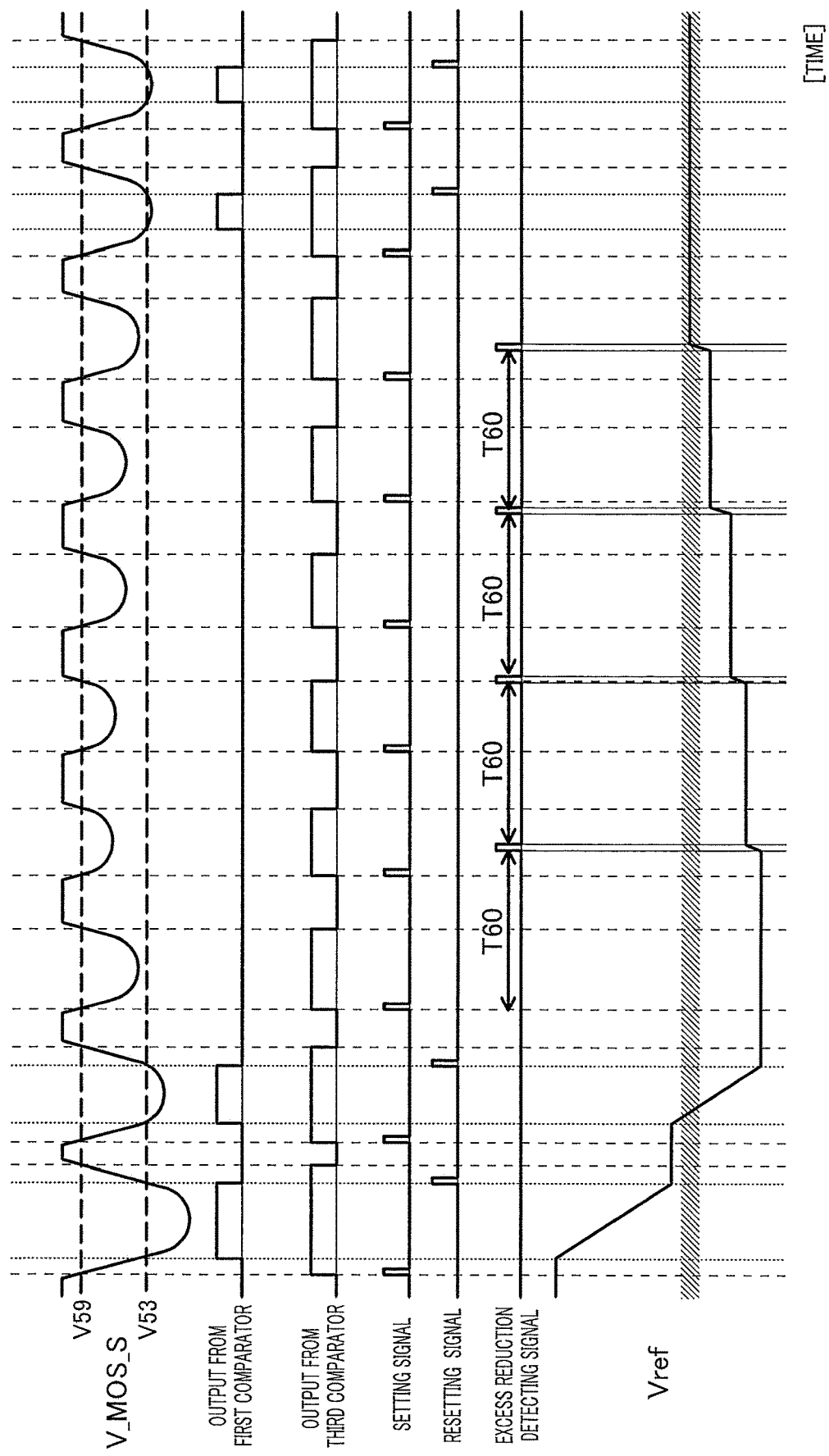
FIG. 15 is a timing chart illustrating the operation of the logical module in FIG. 14.

FIG. 14 is a circuit diagram illustrating an example logical module. FIG. 15 is a timing chart illustrating the operation of the logical module.

The logical module 58 outputs an excess reduction detecting signal to turn on the switch SW3 for a predetermined time after a preset time longer than the ripple cycle is elapsed during no output from the first comparator 51, based on the output from the first comparator 51 and the output from the third comparator 57. In detail, with reference to FIG. 15, the logical module 58 starts the count of the timer 587 from the rising edge in the third comparator 57 and resets the count of the timer 587 at the falling edge in the first comparator 51. Alternatively, the count of the timer 587 is reset at a time when the timer 587 counts a predetermined time T60. If the count of the timer 587 exceeds the predetermined time T60, which is longer than the ripple cycle, the excess reduction detecting signal is outputted to turn on the switch SW3 for the predetermined pulse term. For example, the predetermined time T60 may be set at approximately 12 ms for a ripple cycle of 100 Hz or 120 Hz. The excess reduction indicates that the rate of the ripple component in the output current Iout is less than a target convergence value (for example, 10%).

As shown as an example in FIG. 14, the logical module 58 includes a front edge detector 581 that detects the rising edge of the output from the third comparator 57, and a reverter 582 and a rising edge detector 583 that detect the falling edge of the output from the first comparator 51. The logical module 58 further includes a flip-flop 586 that transmits the output from the front edge detector 581 to a set terminal through an OR circuit 584, and a timer 587 that counts the predetermined time T60 while the output from the flip-flop 586 is being at a high level. The logical module 58 further includes a one-shot circuit 588 that outputs a pulse with a predetermined width when the timer 587 counts the predetermined time T60, and a retarder 589. The retarder 589 performs retardation such that a reset signal is outputted to the flip-flop 586 when the excess reduction detecting signal is outputted, and a set signal is outputted to the flip-flop 586 after the setting. The output from the front edge detector 583 is transmitted to a reset terminal of the flip-flop 586 through the OR circuit 585, and the output from the retarder 589 is transmitted to the two OR circuits 584 and 585. The retarder 589 should perform retardation for a term while the stable operation of the timer 587 is ensured (for example, 100 ns) Such a circuit configuration ensures the operation of the logical module 58.

As described above, the power supply device 1F of the seventh embodiment achieves a balanced state that generates a slight amount of ripple component in the output current Iout, by the same operation as that in the first embodiment. The power supply device 1F of the seventh embodiment can prevent an excess reduction in the reference voltage Vref by the logical module 58 after the balanced state. Some variable factor after a balanced state containing a slight amount of ripple component in the output current Iout may cause a further reduction in ripple component in the output current Iout to increase the loss in the transistor M1. The logical module 58 raises the reference voltage Vref to slightly increase the ripple component in the output current Iout if the term when the bottom voltage of the source voltage V_MOS_S is in the range between the second divided voltage V59 and the first divided voltage V53 is prolonged. The magnitude of the ripple component in the output current Iout is thereby controlled so as not to deviate from the rate (for example, 10%) determined by the first divided voltage V53. Such control can suppress the ripple component in the output current Iout and minimize the loss in the transistor M1 for a long term.

The power supply device 1F of the seventh embodiment generates the second divided voltage V59 and counts the term during which no output from the first comparator 51 based on the comparison with the source voltage V_MOS_S. Alternatively, the second divided voltage V59 and the third comparator 57 may be eliminated and the excess reduction may be detected by counting a term during which the first comparator 51 does not output a high-level voltage from the last high-level output. The logical module 58 of the seventh embodiment counts the term with the timer 587. Alternatively, the term may be determined using the ripple cycle contained in the output voltage VLED−, without use of the timer 587. An example of such configurations is a modification shown in FIG. 16. The logical module 58 of the seventh embodiment may be replaced with a logical module 58G in FIG. 16. In the modification shown in FIG. 16, the generation of the second divided voltage V59 and the third comparator 57 can be omitted.

Modifications

Figure 16:
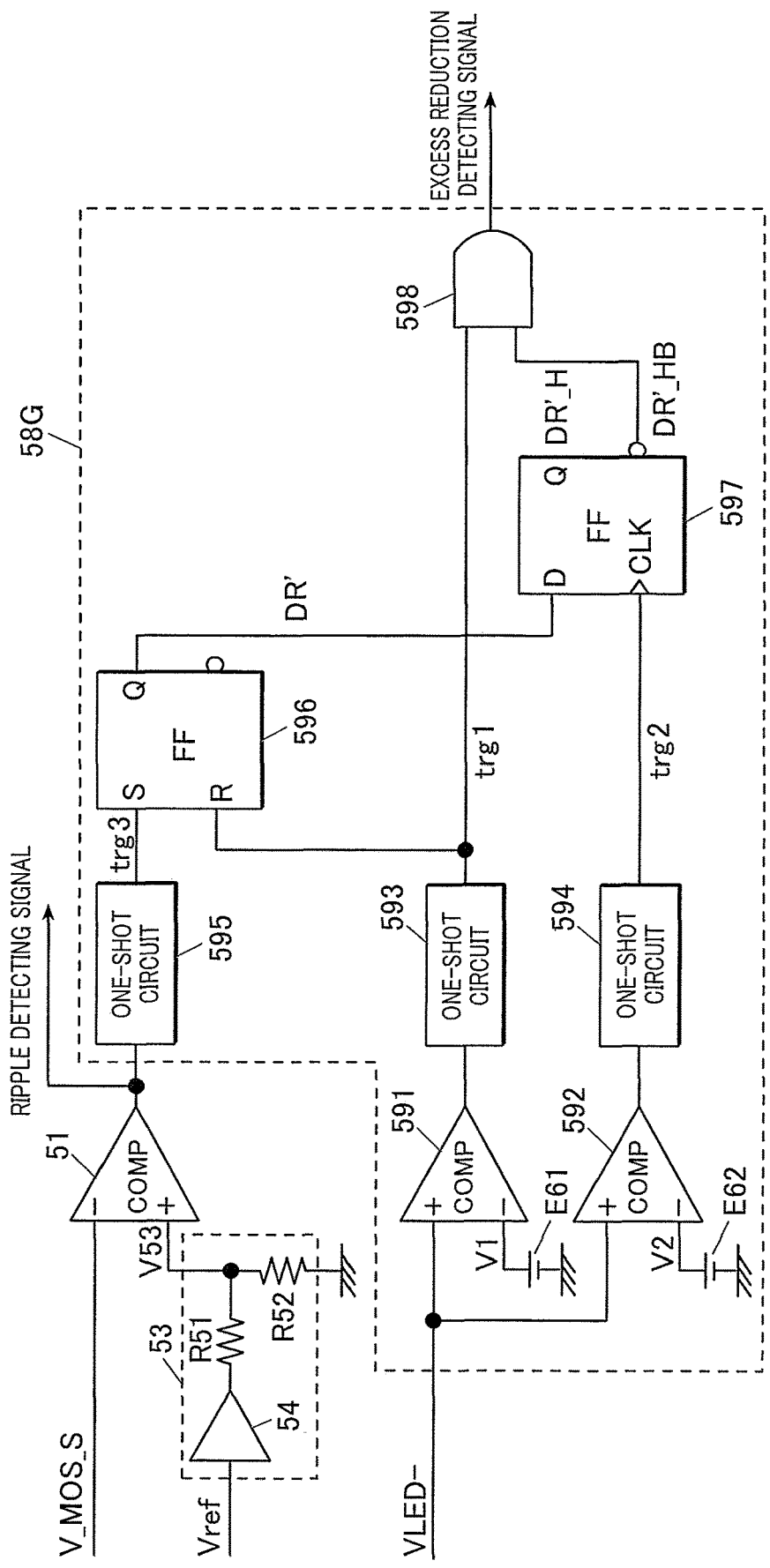
FIG. 16 is a circuit diagram illustrating an example modification of the logical module.
Figure 17:
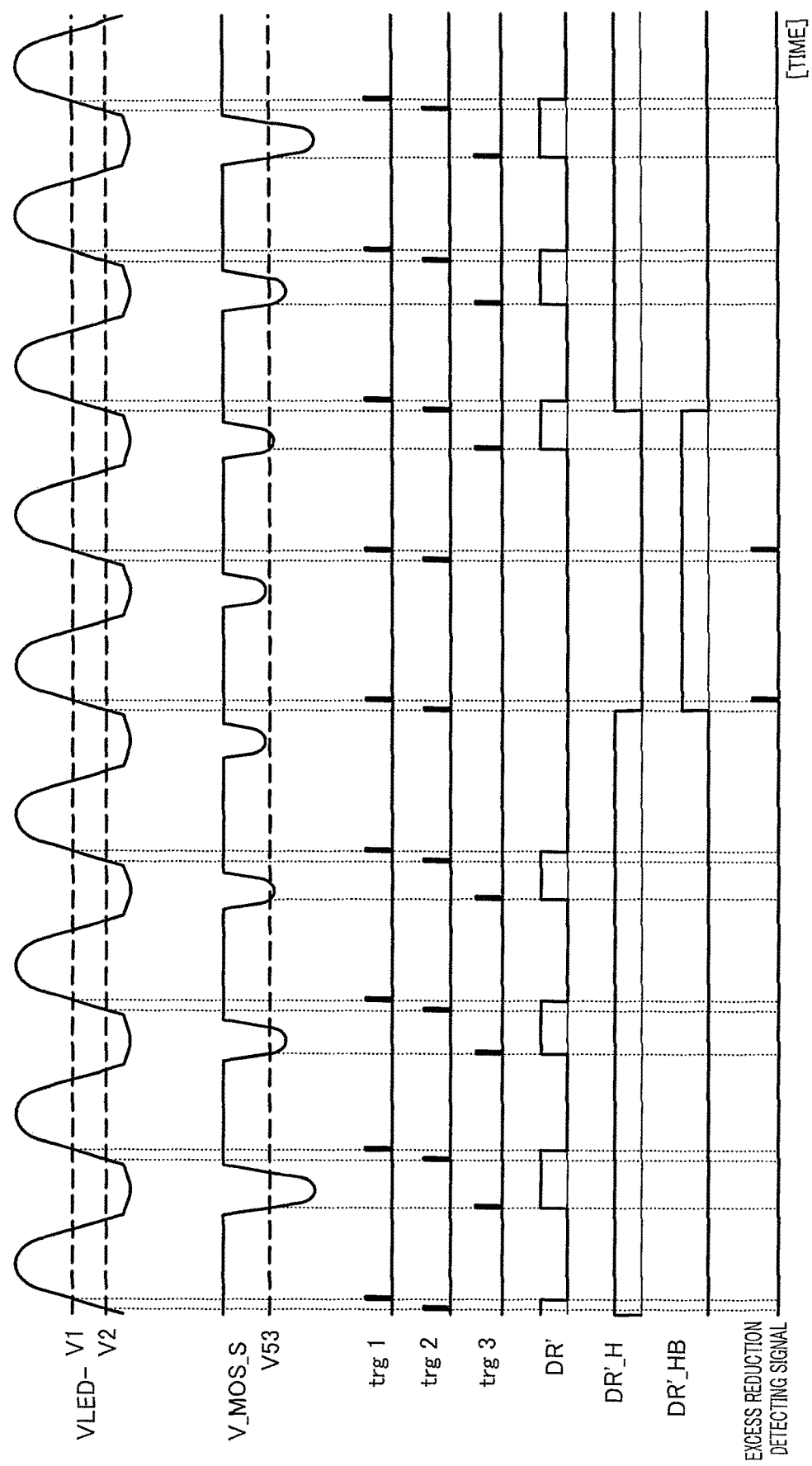
FIG. 17 is a timing chart illustrating the operation of the logical module in FIG. 16.

FIG. 16 is a circuit diagram illustrating an example modification of the logical module. FIG. 17 is a timing chart illustrating the operation of the logical module in FIG. 16.

The logical module 58G of the modification includes two comparators 591 and 592 that compares the output voltage VLED− with two reference voltages V1 and V2 and two one-shot circuits 593 and 594 to provide a criterion for determination. The reference voltages V1 and V2, respectively, are generated by generator circuits E61 and E62 so as to lie between the bottom ripple voltage and the top ripple voltage occurring in the output voltage VLED−. Such a configuration can generate two trigger signals Trg1 and Trg2 having a substantially ripple cycle.

The logical module 58G includes a one-shot circuit 595 that detects the rising edge of the output from the first comparator 51 and outputs a trigger signal Trg3, a flip-flop 596 that transmits the trigger signal Trg3 to the set terminal and transmits the trigger signal Trg1 to the reset terminal. In response to the output of high-level voltage from the first comparator 51, the flip-flop 596 can output a ripple detecting signals DR' overlapping the trigger signal Trg2.

The logical module 58G further includes a D flip-flop 597 that receives the ripple detecting signal DR' at a D terminal and the trigger signal Trg2 at a clock terminal. The D flip-flop 597 can maintain the detected result on the high-level signal from the first comparator S1 in a single ripple cycle determined by the trigger signal Trg2 as a clock signal. As a result, the D flip-flop 597 outputs a ripple detection hold signal DR'_H and a reverted ripple detection hold signal DR'_HB that maintains the detected result (for the term of the ripple cycle).

The logical module 58G further includes an AND circuit 598 that receives the trigger signal Trg1 and the ripple detection hold signal DR'_HB through two input terminals and that outputs an excess reduction detecting signal.

The logical module 58G with such a configuration generates signals in corporation with the relevant components shown in FIG. 17 and outputs an excess reduction signal if the source voltage V_MOS_S does not fall below the first divided voltage V53 during the ripple cycle. The excess reduction signal slightly raises the reference voltage Vref and thus slightly increases the ripple component in the reference voltage Vref. Such an operation can reduce the deviation of the ripple component in the output current Iout from a rate (for example, 10%) determined by the first divided voltage V53. The reduction in the deviation can suppress the ripple component in the output current Iout and minimize the loss in the transistor M1 for a long term.

The embodiments of the present invention have been described above. The present invention, however, may further includes other embodiments. For example, the first potential point to output a DC voltage containing ripple from the voltage converter circuit is the output terminal Tb (drain voltage of the transistor M1) in the embodiments described above. Alternatively, the first potential point of the present invention may be disposed at any point in an output current path from the output at a high potential side of the voltage converter circuit to the current controller. In the embodiments described above, the current detecting voltage indicating the magnitude of the output current is a source voltage V_MOS_S. If the current detecting element (for example, current detecting resistor) is provided at any other position on the output current path, the current detecting voltage can be extracted from this position. In the embodiments described above, the constant current circuit has the current detecting resistor R1. Alternatively, the current detecting resistor R1 may be replaced with a load connected to the output terminals to and tb in the constant-current circuit. The examples of the comparator are first to third comparators in the embodiments described. Alternatively, the comparison may be carried out by combination of differential circuits and/or logical circuits.

The power supply source of the present invention is applied to drive a light emitting diode in the embodiments described above. The power supply device of the present invention can also be applied to drive organic EL (electroluminescent) device for lighting or to drive any load consuming certain current. The DC/DC converter may be a forward converter, a non-insulating step-up/step-down converter, or any other type of converter. Furthermore, the configurations described in the embodiments, such as the type of the transistor for current control and the configuration of a variation adder that vary the current value controlled by the current circuit, can be modified within the scope of the gist of the invention.

What is claimed is:

1. A power supply device comprising:
    a voltage conversion circuit that generates a DC voltage from an AC power source and outputs the DC voltage to a pair of output terminals;
    a current controller that is disposed on a first current path through which an output current flows and that controls the current in the first current path; and
    a current controlling circuit that drives the current controller so as to reduce a ripple component generated in the output current, based on (i) a voltage at a first potential point set on a path from an output terminal at a high-potential side of the voltage conversion circuit to the current controller in the first current path and (ii) a current detecting voltage indicating a magnitude of the output current,
    wherein the current controlling circuit comprises:
    a voltage-retaining module that retains a reference voltage;
    a differential circuit that outputs a drive signal to the current controller so as to decrease a difference between the reference voltage and the current detecting voltage;
    a reducing circuit that reduces the reference voltage;
    a first voltage divider circuit that generates a first divided voltage generated at a predetermined division ratio from the reference voltage; and
    a first comparator that compares the first divided voltage with the current detecting voltage and allows the reducing circuit to lower the reference voltage if the first divided voltage is higher than the current detecting voltage.

2. The power supply device according to claim 1, wherein the current controlling circuit drives the current controller such that a bottom ripple voltage at the first potential point converges to a balanced voltage which is a minimum voltage.

3. The power supply device according to claim 2, wherein the current controlling circuit further comprises:
    a bottom voltage controller that receives the voltage at the first potential point as a detection voltage and controls the reference voltage based on a comparison of detection voltages at different times.

4. The power supply device according to claim 3, wherein the current controlling circuit further comprises:
    a variation adder that adds a variation to the reference voltage held by the voltage-retaining module.

5. The power supply device according to claim 1, wherein the current controlling circuit further comprises:
    a first raising circuit that raises the reference voltage; and
    a second comparator that compares the voltage at the first potential point with a predetermined reference voltage and allows the first raising circuit to raise the reference voltage if the voltage at the first potential point is higher than the predetermined reference voltage.

6. The power supply device according to claim 5, wherein:
    the reference voltage is set above the voltage at the first potential point where the output current contains no ripple component, and
    the division ratio of the first voltage divider circuit is set to 1−x, where x is a ratio of an allowable ripple current to an upper end value of the output current.

7. The power supply device according to claim 5, wherein a voltage lowering capacity of the reducing circuit is lower than a voltage raising capacity of the first raising circuit.

8. The power supply device according to claim 5, where the current controlling circuit further comprises:
    a second raising circuit that raises the reference voltage with a capacity lower than a voltage lowering capacity of the reducing circuit;
    a logical module that permits the second raising circuit to raise the reference voltage after a term during which the current detecting voltage does not fall below the first divided voltage exceeds a predetermined term; and
    a second voltage divider circuit that divides the reference voltage to generate a second divided voltage higher than the first divided voltage; and
    a third comparator that compares the second divided voltage with the current detecting voltage,
    wherein the logical module allows the second raising circuit to raise the reference voltage based on a result of comparison by the second comparator and a result of comparison by the third comparator after the current detecting voltage falls below the second divided voltage and after a term during which the current detecting voltage does not fall below the first divided voltage exceeds a predetermined term.

9. The power supply device according to claim 1, wherein the current controlling circuit further comprises:
    a second raising circuit that raises the reference voltage with a capacity lower than a voltage lowering capacity of the reducing circuit; and
    a logical module that permits the second raising circuit to raise the reference voltage after a term during which the current detecting voltage does not fall below the first divided voltage exceeds a predetermined term.

10. The power supply device according to claim 1, further comprising a lighting device connected to the pair of output terminals.

11. A semiconductor integrated circuit that (i) is mounted in a power supply device including a voltage conversion circuit that generates a DC voltage from an AC power source and outputs the DC voltage to a pair of output terminals and (ii) drives a current controller that controls a current in a current path through which an output current flows, the circuit comprising:
    a differential circuit that outputs a drive signal to the current controller so as to decrease a difference between a reference voltage and a current detecting voltage indicating a magnitude of the output current;
    a first comparator that (i) compares a first divided voltage generated by division of the reference voltage with the current detecting voltage and (ii) lowers the reference voltage if the current detecting voltage is lower than the first divided voltage; and
    a second comparator that (i) compares a predetermined reference voltage with a voltage at a first potential point set on a path from an output terminal at a high potential side of the voltage conversion circuit to the current controller in the current path through which the output current flows, and (ii) raises the reference voltage if the voltage at the first potential point is higher than the predetermined reference voltage.

12. A method for suppressing a ripple component in a power supply device including a voltage conversion circuit that generates a DC voltage from an AC power source and outputs the DC voltage to a pair of output terminals, the method comprising:

driving a current controller that controls a current in a current path through which an output current flows; and suppressing the ripple component occurring in the output current, wherein the method further comprises:

outputting a drive signal to the current controller such that a difference between a reference voltage and a current detecting voltage indicating a magnitude of the output current is decreased;

comparing the current detecting voltage with a first divided voltage generated by division of the reference voltage and lowering the reference voltage if the current detecting voltage is lower than the first divided voltage; and comparing a predetermined reference voltage with a voltage at a first potential point set on a path from an output terminal at a high potential side of the voltage conversion circuit to the current controller in the current path through which the output current flows, and raising the reference voltage if the voltage at the first potential point is higher than the predetermined reference voltage.

* * * * *